United States Patent
Fujinoki et al.

[11] Patent Number: 5,970,746
[45] Date of Patent: Oct. 26, 1999

[54] METHOD FOR PREPARING SILICA GLASS ARTICLE

[75] Inventors: Akira Fujinoki; Akihiko Sugama, both of Fukushima; Masaatsu Kataoka, Fukui, all of Japan; Wolfgang Englisch, Kelkheim, Germany

[73] Assignees: Shin-Etsu Quartz Products Co., Ltd., Tokyo, Japan; Haraeus Quarzglas GmbH, Hanau, Germany

[21] Appl. No.: 09/028,684

[22] Filed: Feb. 24, 1998

Related U.S. Application Data

[62] Division of application No. 08/396,517, Mar. 1, 1995, Pat. No. 5,790,315.

[30] Foreign Application Priority Data

Mar. 26, 1994 [JP] Japan .................................. 6-93990

[51] Int. Cl.⁶ .................................................. C03B 23/04
[52] U.S. Cl. ................................... 65/102; 65/64; 65/292
[58] Field of Search ............................. 65/17.6, 63, 64, 65/111, 102, 109, 134.1, 135.2, DIG. 8, 292, 269, 375; 359/654, 653, 652, 664

[56] References Cited

U.S. PATENT DOCUMENTS

| | | |
|---|---|---|
| 2,904,713 | 9/1959 | Heraeus et al. . |
| 3,485,613 | 12/1969 | Herczog et al. . |
| 4,268,112 | 5/1981 | Peterson . |
| 5,086,352 | 2/1992 | Yamagata et al. . |
| 5,443,607 | 8/1995 | Englisch et al. . |
| 5,790,315 | 8/1998 | Fujinoki et al. . |

FOREIGN PATENT DOCUMENTS

| | | |
|---|---|---|
| 42 04 406 | 8/1993 | Germany . |
| 5-147957 | 6/1993 | Japan .................................. 65/DIG. 8 |

*Primary Examiner*—Steven P. Griffin
*Attorney, Agent, or Firm*—Scully, Scott, Murphy & Presser

[57] ABSTRACT

A method of preparing a ball-shaped synthetic silica glass optical article. The method includes a step of providing a rod-shaped synthetic silica glass having end faces at both sides thereof and having fewer cords per unit volume viewed in a direction perpendicular to a line connecting the end faces relative to the number of cords per unit volume viewed in a direction along the line connecting the end faces. The synthetic silica glass being optically homogeneous in the direction perpendicular to the line connecting the end faces. The method includes the further step of establishing support portions at the end faces of the synthetic silica glass. The rod-shaped synthetic silica glass is thereupon heated while being rotated around an axis connecting the support portions wherein a molten zone is formed. The molten zone of the rod-shaped synthetic silica glass is thereupon deformed by the application of pressure along the axis connecting the support portions whereupon a high purity ball-shaped optical article, having end faces and a side face positioned between the end faces, is formed. The optical article is characterized by a lesser number of cords per unit volume, viewed in a direction perpendicular to a line connecting the end faces relative to the number of cords per unit volume viewed in a direction along the line connecting the end faces. The rod-shaped synthetic silica glass is furthermore optically homogeneous in a direction perpendicular to the line connecting the end faces. The method is concluded by cutting the ball-shaped optical article at the edge support portions.

1 Claim, 8 Drawing Sheets

METHOD FOR PREPARING SILICA GLASS ARTICLE

CROSS REFERENCES TO RELATED APPLICATIONS

This is a divisional of U.S. patent application Ser. No. 08/396,517 Mar. 1, 1995, now U.S. Pat. No. 5,790,315.

FIELD OF THE INVENTION

The present invention relates to a unidirectionally highly homogeneous massive formed article of synthetic silica glass as a raw material for making a highly homogeneous formed article of synthetic silica glass for optical use and, in particular, to a unidirectionally highly homogeneous massive formed article of synthetic silica glass useful as a raw material for preparing highly homogeneous synthetic silica glass formed article for optical use, which is free of any cord and which can easily be homogenized in the whole directions and from which cords can easily be removed.

The present invention also relates to a highly homogeneous synthetic silica glass formed article for optical use, which is free of any cord, in particular, a method for preparing a synthetic silica glass formed article for optical parts suitably used in optical systems which are used in exposure devices for photolithography such as deep UV lithography wherein ultraviolet rays emitted from, for instance, an excimer laser, which is quite highly homogeneous and free of any cord in the three directions perpendicular to one another and which has high transparency to these ultraviolet rays and is stable to irradiated ultraviolet light rays.

The present invention likewise relates to a method for preparing a synthetic silica glass formed article which is suitable for use in making homogeneous optical parts of synthetic silica glass used as optical systems for ultraviolet rays such as lenses and prisms constituting optical systems for ultraviolet rays, which is free of any cord and highly homogeneous and which has optically high transmittance to ultraviolet rays.

BACKGROUND OF THE PRIOR ART

In the production of semiconductor devices, the lithography technique for forming integrated circuit patterns on semiconductor wafers has strikingly been advanced. In particular, the wavelength of the light rays used in the lithography has increasingly been reduced and changed, for instance, from i-rays emitted from mercury lumps (365 nm) to light rays emitted from excimer lasers such as KrF excimer laser (248 nm) as the degree of integration of LSI's increases. Such reduction in the wavelength of light rays used in the lithography requires the use of silica glass optical parts having high transmittance to ultraviolet rays as optical parts incorporated into the optical system used in the lithography instead of the conventional multicomponent glass optical parts, in particular, the use of chemically purified synthetic silica glass optical parts having highly improved transmittance to ultraviolet rays. Moreover, such optical parts incorporated into these optical systems of high precision should satisfy more strict requirements such as quite excellent transmittance to ultraviolet rays and very high optical homogeneity.

In general, the glass sometimes shows abrupt change in its refractive index appearing in the streak-like or lamellar configuration. Such a heterogeneous structure is generally called "cord" and is distinguished from the homogeneity in the refractive index. In addition, the glass has heterogeneous structures which are accompanied by a change in the refractive index of the glass and such heterogeneous structures are caused due to the heterogeneity of compositions and the heterogeneity in thermal and other conditions during the production thereof. In the optical glass, such a heterogeneous structure including such a cord is a defect which should be removed since the structure would distort the optical path. Furthermore, the optical glass must also satisfy the strict requirements for the homogeneity in the refractive index to an extent depending on the precision required for specific optical systems in order to obtain a highly precise transmitting wave surface.

In the production of optical glass for general use, the homogenization of the refractive index is carried out by compulsorily stirring a melt of molten glass and then gradually cooling the melt under quite strict temperature control in order to satisfy these requirements.

However, it is difficult to heat the silica glass in a crucible up to a high temperature at which the silica glass is in a molten state having a low viscosity because of the nature peculiar thereto. On the contrary, the silica glass has a sufficiently high viscosity even at a high temperature and is insufficient in the flyability. For this reason, it is in fact difficult to obtain silica glass having satisfactory optical homogeneity through a mixing operation such as stirring.

As means for homogenizing such silica glass, for instance, U.S. Pat. No. 2,904,713 discloses a method for homogenizing the whole composition of silica glass which comprises locally heating the silica glass while supporting both ends thereof by a lathe for processing silica glass to partially form a molten zone within the silica glass, twisting, expanding and contracting the molten zone through application of an external force thereto so that the ends approach or are separated from one another while rotating the ends in different manners to move the molten zone over the entire length of the silica glass.

U.S. Pat. No. 3,485,613 discloses a method for performing homogenization of silica glass, called lateral zone melting method, which comprises setting the viscosity of the molten portion of the silica glass, i.e., the molten zone at a level of not more than 1013 P and moving the molten zone over the entire length of the silica glass while twisting the molten zone of the silica glass by rotating both ends of the silica glass in the same direction and at different numbers of revolutions or in different directions.

These techniques for homogenizing silica glass do not intend to eliminate the cord present in silica glass, but U.S. Pat. No. 5,086,352 and Japanese Un-examined Patent Publication (hereunder referred to as "J.P. KOKAI") No. Hei 3-88742 disclose that the cord of silica glass can be removed through these homogenization techniques for silica glass.

Moreover, DEOS No. 42 04 406 A1 discloses a method for eliminating cords of natural and synthetic silica glass in the three directions perpendicular to one another, in which the homogenization of the silica glass while establishing a second rotation axis perpendicular to a first rotation axis for homogenization is carried out by molding a silica glass formed article subjected to a first homogenization in, for instance, an inverted T-shaped mold of graphite having a square cross section to form a rod-like synthetic silica glass having a square cross section and a longitudinal axis in the direction perpendicular to the rotation axis, for the first homogenization treatment, of the rod-like silica glass formed article subjected to the first homogenization, carrying out a second homogenization while using the longitudinal axis as a second rotation axis to completely eliminate cords in the three directions perpendicular to one another in quite high efficiency.

In addition, the method for homogenizing a silica glass material along the two axes perpendicular to one another and for removing cords as disclosed in the foregoing DEOS No. 42 04 406 A1 permits, for the first time, the economical production of a highly homogeneous silica glass formed article free of cord, which may be used in, for instance, the photolithography.

Incidentally, the synthetic silica glass has been used as a silica glass raw material for optical use because of high purity, in particular, a low content of metallic impurities and excellent light transmittance to light rays falling within the ultraviolet region and is prepared according to the direct method or the soot method. For instance, the vapor phase axial deposition method (VAD method) basically comprises the steps of subjecting a volatile silicon compound to the flame hydrolysis, depositing, as a layer, silica fine particles formed during the flame hydrolysis on a substrate which is rotated and then transparentizing the deposit of silica particles. A lamellar heterogeneous structure is thus formed during growing a synthetic silica glass ingot through the transparentizing step and this serves as a lamellar heterogeneous portion in the resulting synthetic silica glass ingot.

Such a lamellar growing stripe in the synthetic silica glass ingot is formed in the form corresponding to the shape of the growing front of the synthetic silica glass and the stripe accordingly form a cord having a curved surface such as approximately a hemispherical surface. A cord having such a curved surface is likewise observed in the synthetic silica glass ingot produced by the direct method and such a cord is considered to be one of the cords present in the synthetic silica glass whose removal is most difficult.

Therefore, if the synthetic silica glass which is once homogenized by, for instance, a simple lateral zone melting method is examined by a strain detector and an interferometer, it would be confirmed that the optical homogeneity thereof in the direction perpendicular to the rotation axis used during the homogenization is lower than that observed in the direction along the rotation axis. This clearly indicates that the effect of the mixing is almost ineffective for the homogeneity in the direction parallel to the rotation axis. Accordingly, it is concluded that the simple lateral zone melting method permits the removal of unidirectional cord and homogenization, but it is very difficult to achieve the removal of cord and homogenization in the three directions perpendicular to one another and that the method is less efficient.

In order to achieve the removal of cord and homogenization in the three directions through homogenization treatment according to such a simple lateral zone melting method, the lateral zone melting procedures should be repeated over a number of times and this requires much expenses. Moreover, if the lateral zone melting procedures are repeated to remove cord, the optical homogeneity of the resulting product in the direction perpendicular to the rotation axis is not always sufficiently high, the silica glass formed article does not show the quality required for optical use and also suffers from a problem of cost.

As seen from these points, the method for homogenizing silica glass comprising natural and synthetic silica glass as disclosed in the foregoing DEOS No. 42 04 406 A1 is an excellent method and permits the production of silica glass free of cords and having high homogeneity in the three directions perpendicular to one another. However, the silica glass formed article as a product prepared by this method shows low transmittance to, in particular, ultraviolet rays falling within the wavelength range of not more than 250 nm and emits fluorescent light rays through irradiation with ultraviolet rays. Therefore, it has been found that the method is insufficient for forming a silica glass article capable of transmitting light emitted from an excimer laser or ultraviolet rays falling within the same wavelength range.

It would be assumed that this problem is caused due to the following fact. The rotation axis for the second homogenization is established by molding synthetic silica glass in a graphite mold according to a high temperature heat-molding method to give a synthetic silica glass molded article, the resulting silica glass article is contaminated by graphite through the contact between the glass and the graphite mold at a high temperature during the molding, and thus the impurities originated from the graphite and present in the silica glass molded article are uniformly distributed throughout the silica glass article during the second homogenization step.

Metallic impurities should be removed from the silica glass as much as possible to produce silica glass articles having good optical stability to the light rays emitted from an excimer laser. For instance, the optical parts of synthetic silica glass must have alkali and alkaline earth metal contents each of which is not more than 50 ppb and transition metal contents each of which is not more than 10 ppb.

In general, the synthetic silica glass formed articles for optical use have been formed according to a high temperature heat-molding method which makes use of a graphite mold. However, when forming a high purity silica glass article capable of transmitting light emitted from an excimer laser or ultraviolet rays falling within the same wavelength range, the formed article is inevitably contaminated through the contact with the graphite mold. For this reason, the application of the high temperature heat-molding method using a graphite mold is limited to the forming steps subsequent to the final homogenization step. If the high temperature heat-molding method using a graphite mold is simply applied to the forming steps subsequent to the final homogenization step, the silica glass formed article is contaminated at only the portions which comes in contact with the graphite mold and accordingly, any influence of such impurities can be eliminated by, if necessary, scraping such contaminated portions. In this case, however, the graphite mold has been produced from graphite having a purity as high as possible to minimize the contamination due to contact between the silica glass and the graphite mold.

Accordingly, the principal object of the present invention is to solve the problem associated with the method for preparing a highly homogeneous silica glass formed article free of cords in the three directions perpendicular to one another, which relates to contamination of the article through the contact with the graphite mold, as disclosed in the foregoing DEOS No. 42 04 406 A1 and to further improve the cord-removing effect and the homogeneity of the resulting formed article.

SUMMARY OF THE INVENTION

The inventors of this invention have intensively examined the techniques for producing highly homogeneous synthetic silica glass formed articles free of cords in the three directions perpendicular to one another, represented by the method disclosed in the foregoing DEOS No. 42 04 406 A1, have developed a non-contact means for molding synthetic silica glass for the purpose of preparing optical parts for use in optical systems using excimer laser rays which should satisfy the requirements of high purity, high light-transmittance and high stability to light-irradiation, as a result, have found out molding conditions required for highly homogenizing synthetic silica glass formed articles and thus have completed the present invention.

Accordingly, an object of the present invention is to provide a method for preparing a silica glass formed article for optical use, in particular, suitable as a raw material for optical parts irradiated with light rays emitted from an excimer laser, which permits the production of a silica glass formed article for optical use free of cords and highly homogeneous in the three directions perpendicular to one another, in a non-contact manner, i.e., without using any graphite mold, by carrying out a second homogenization treatment while establishing a second rotation axis in the direction perpendicular to the rotation axis used in a first homogenization step as well as a method for preparing an intermediate therefore.

More specifically, the present invention relates to a massive formed article of high purity synthetic silica glass which is characterized in that the massive formed article has end faces at both sides thereof, a side face positioned between the end faces, at least a part of which is externally projected beyond the outlines of the end faces and an optical homogeneity in the direction perpendicular to the line connecting the end faces lower than that observed in the direction along the line connecting the end faces, the present invention also relates to a method for preparing a high purity massive formed article of synthetic silica glass which comprises: a step of forming a massive formed article of synthetic silica glass, which comprises providing a rod-like synthetic silica glass having end faces at both sides thereof and an optical homogeneity in the direction perpendicular to the line connecting the end faces lower than that observed in the direction along the line connecting the end faces, establishing support portions at longitudinal edges thereof, heating the rod-like synthetic silica glass while rotating the silica glass rod around the axis connecting the support portions to form a molten zone, and deforming the molten zone of the rod-like synthetic silica glass through application of a pressure thereto along the axis; and a step of cutting the massive synthetic silica glass formed in the foregoing forming step at the edge support portions thereof to form a high purity massive molded article of synthetic silica glass which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces, and the present invention further relates to a method for preparing a high purity massive molded article of synthetic silica glass which comprises: a homogenizing step comprising securing support members to both longitudinal edges of a rod-like synthetic silica glass material; heating the silica glass material while rotating the support members to molten a part of the silica glass material and to thus form a molten zone; applying an external force to the molten zone through the support members to form a boundary area within the molten zone; and moving the boundary area of the molten zone along the rotation axis of the rod-like synthetic silica glass material so that the synthetic silica glass material has an optical homogeneity in the direction perpendicular to the line connecting the end faces lower than that observed in the direction along the line connecting the end faces; a step of forming a massive molded article of synthetic silica glass comprising applying a pressure, along the direction of the rotation axis through the support members, to the rod-like synthetic silica glass to which support members have been secured in the longitudinal direction of the silica glass rod, a part of which has been molten to form the molten zone and which is rotatable, through the homogenizing step, to thus deform the molten zone of the synthetic silica glass material; and a step of cutting a massive synthetic silica glass formed in the foregoing forming step away from the support members to form a high purity massive molded article of synthetic silica glass which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces.

According to the present invention, there is provided a method for preparing a highly homogeneous rod-like formed article of synthetic silica glass for optical use, which comprises: a step for fitting support members to opposite portions on the side face of a high purity massive formed article of synthetic silica glass which has end faces at both sides thereof and a side face positioned between the end faces, at least a part of which is externally projected beyond the outlines of the end faces and whose optical homogeneity in the direction perpendicular to the line connecting the end faces is lower than that of the article observed in the direction along the line connecting the end faces; a forming step comprising heating the massive formed article which is rotated through the rotation of the support members to form a molten zone in the massive formed article, and drawing the molten zone of the massive formed article by outwardly pulling at least one of the support members towards the direction along the rotation axis thereof to form a rod-like synthetic silica glass; and a homogenizing step comprising heating the rod-like synthetic silica glass formed in the forming step while rotating the silica glass by rotating the support members to partially form a molten zone in the rod-like silica glass, applying an external force to the molten zone through the support members to form a boundary area within the molten zone, and moving the boundary area of the molten zone along the rotation axis of the rod-like silica glass to form a rod-like formed article of synthetic silica glass which is homogeneous in the three directions perpendicular to one another.

According to the present invention, there is further provided a method for preparing a highly homogeneous rod-like formed article of synthetic silica glass for optical use, which comprises: a first step of forming a massive formed article of synthetic silica glass, which comprises providing a rod-like synthetic silica glass having end faces at both sides thereof and an optical homogeneity in the direction perpendicular to the line connecting the end faces lower than that observed in the direction along the line connecting the end faces, establishing support portions at longitudinal edges thereof, heating the rod-like synthetic silica glass while rotating the silica glass rod around a first axis along the line connecting the support portions to form a molten zone, and deforming the molten zone of the rod-like synthetic silica glass through application of a pressure thereto along the first axis; a step of cutting the massive synthetic silica glass formed in the foregoing first forming step at the support portions thereof to form cut end faces and to form a high purity massive formed article of synthetic silica glass which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces; a step for establishing opposite support portions at both sides of the side face of the massive formed article formed in the cutting step; a second forming step comprising heating the massive formed article while rotating the massive formed article around a second axis along the line connecting these support portions to form a molten zone, and drawing the massive formed article into a rod-like body by outwardly pulling at least one of the support portions established in the foregoing establishing step towards the direction of the second axis to form a rod-like synthetic silica glass; and a homogenizing step comprising heating the rod-like synthetic silica glass formed in the second forming step while rotating the silica glass around the second axis along the line connecting the support portions to partially form a molten zone in the rod-like silica glass, applying an external force to the molten zone to form a boundary area within the molten zone, and moving the boundary area along the second axis of the rod-like silica glass to form a rod-like formed article of synthetic silica glass which is homogeneous in the three directions perpendicular to one another, and the present invention further provides a method for preparing a high purity rod-like formed article of synthetic silica glass, which comprises: a homogenizing step comprising establishing support portions at longitudinal edges of rod-like synthetic silica glass; heating the rod-like silica glass while rotating it around a first axis along the line connecting the support portions to partially form a molten zone in the rod-like silica glass; applying an external force to the molten zone to form a boundary area within the molten zone of the rod-like silica glass; and moving the boundary area of the molten zone along the first axis in such a manner that the synthetic silica glass material has an optical homogeneity in the plane perpendicular to the first axis higher than that observed in the plane parallel to the firstaxis; a first forming step of forming a massive formed article of synthetic silica glass, which comprises deforming the molten zone of the rod-like synthetic silica glass through application of a pressure thereto along the first axis, which has been heated while rotating it around the first axis to form a molten zone, through the first homogenizing step, to thus give a massive synthetic silica glass; a step of cutting the massive synthetic silica glass formed in the foregoing first forming step at the support portions thereof to form cut end faces and to form a high purity massive formed article of synthetic silica glass which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces; a step for establishing opposite support portions at both sides of the side face of the massive formed article formed in the separating step; a second forming step comprising heating the massive formed article while rotating the massive formed article around a second axis along the line connecting these support portions to form a molten zone, and drawing the massive formed article into a rod-like body by outwardly pulling at least one of the support portions established in the foregoing establishing step towards the direction of the second axis to form a rod-like synthetic silica glass; and a homogenizing step comprising heating the rod-like synthetic silica glass formed in the second forming step while rotating the silica glass around the second axis along the line connecting the support portions to partially form a molten zone in the rod-like silica glass, applying an external force to the molten zone to form a boundary area within the molten zone, and moving the boundary area along the second axis of the rod-like silica glass to form a rod-like formed article of synthetic silica glass which is homogeneous in the three directions perpendicular to one another.

The present invention likewise provides a method for preparing highly homogeneous formed article of synthetic silica glass for optical use, which comprises: a step for establishing support portions at opposite ends of the side face of a high purity massive formed article of synthetic silica glass having end faces at both sides thereof, a side face positioned between the end faces, at least a part of which is externally projected beyond the outlines of the end faces and an optical homogeneity in the direction perpendicular to the line connecting the end faces lower than that observed in the direction along the line connecting the end faces; a step for forming a rod-like synthetic silica glass comprising heating the massive formed article while rotating it by rotating the support portions around the rotation axis along the line connecting these support portions to form a molten zone within the massive formed article and outwardly pulling at least one of the support portions along the direction of the rotation axis to draw the molten zone of the massive formed article; a homogenizing step comprising heating the rod-like synthetic silica glass formed in the forming step while rotating the silica glass around the axis along the line connecting the support portions to partially form a molten zone in the rod-like silica glass, applying an external force to the molten zone through the support portions to form a boundary area within the molten zone, and moving the boundary area along the rotation axis of the rod-like silica glass to form a rod-like formed article of synthetic silica glass which is homogeneous in the three directions perpendicular to one another; and a final forming step comprising heating and molding the rod-like formed article of synthetic silica glass homogeneous in the three directions in a mold and then heating and gradually cooling the molded article to form a synthetic silica glass formed article for optical use which is homogeneous and free of any strain in the three directions perpendicular to one another, and the present invention further provides a method for preparing highly homogeneous formed article of synthetic silica glass for optical use, which comprises: a first step of forming a massive synthetic silica glass, which comprises providing a rod-like synthetic silica glass having end faces at both sides thereof and an optical homogeneity in the direction perpendicular to the line connecting the end faces lower than that observed in the direction along the line connecting the end faces, establishing support portions at longitudinal edges thereof, heating the rod-like synthetic silica glass while rotating the silica glass rod around a first axis along the line connecting the support portions to form a molten zone, and deforming the molten zone of the rod-like synthetic silica glass through application of a pressure thereto along the first axis; a step of cutting the massive synthetic silica glass formed in the foregoing first forming step at the support portions thereof to form cut end faces and to form a high purity massive formed article of synthetic silica glass which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces; a step for establishing opposite support portions at both sides of the side face of the massive formed article formed in the separating step; a second forming step comprising heating the massive formed article while rotating the massive formed article around a second axis along the line connecting these support portions to form a molten zone, and drawing the massive formed article into a rod-like body by outwardly pulling at least one of the support portions established in the foregoing establishing step towards the direction of the second axis to form a rod-like synthetic silica glass; a homogenizing step comprising heating the rod-like synthetic silica glass formed in the second forming step while rotating the silica glass around the second axis along the line connecting the support portions to partially form a molten zone in the rod-like silica glass, applying an external force to the molten zone to form a boundary area within the molten zone, and moving the boundary area along the second axis of the rod-like silica glass to form a rod-like formed article of synthetic silica glass which is homogeneous in the three directions perpendicular to one another; and a final forming step comprising heating and molding the rod-like formed article of synthetic silica glass homogeneous in the three directions in a mold and then heating and gradually cooling the molded article to form a synthetic silica glass formed article for optical use which is homogeneous and free of any strain in the three directions perpendicular to one another.

In the present invention, the term "homogenization" is used in its broad meaning and includes optical homogenization in addition to the removal of heterogeneity present in a rod-like synthetic silica glass as a raw material and the elimination of any cord. Therefore, the "homogenization" used in the present invention includes the elimination of not only heterogeneity due to changes in concentrations or densities of OH groups, chlorine and structural defects, but also heterogeneity such as cords.

The term "homogeneity of a substance is high in a plane" herein used means that the substance has low changes in concentrations of, for instance, OH groups and chlorine atoms per unit area and has a small number of structural defects per unit area, within the plane interested. Moreover, the expression "the optical homogeneity of a substance in the direction along the line connecting the opposite end faces is low" means that the number of cords per unit area is small, when the substance is inspected for the number thereof by, for instance, a strain detector or an interferometer, while transmitting light rays through the substance along the line connecting the opposite end faces.

Therefore, the passage "the optical homogeneity of, for instance, a massive formed article of synthetic silica glass in the direction perpendicular to the line connecting the end faces thereof is lower than that of the article observed in the direction along the line connecting the end faces" means that when the article is inspected by a strain detector, the number of cords detected by the strain detector while arranging the massive formed article in such a manner that the light rays for the inspection are transmitted therethrough in the direction perpendicular to the line connecting the end faces is greater than that detected by the strain detector while arranging the massive formed article in such a manner that the light rays for the inspection are transmitted therethrough in the direction along the line connecting the end faces. In this case, the optical homogeneity of the article in the plane perpendicular to the line connecting the end faces thereof is higher than that of the article observed in the plane parallel to the line connecting the end faces. For instance, this indicates that cords which are approximately planar and approximately parallel to one another are arranged in a lamellar pattern.

In the massive formed article of synthetic silica glass according to the present invention, the term "the direction along the line connecting end faces" means the direction perpendicular to a cut surface formed by cutting a massive synthetic silica glass away from the support rods and the term "rotation axis" herein means the axis serving as a center of the rotation of a rod-like or massive synthetic silica glass.

In the present invention, the term "perpendicular" includes perpendicular or approximately perpendicular. Therefore, for instance, the direction perpendicular to the line connecting both of the end faces means the direction perpendicular or approximately perpendicular to the line connecting the end faces.

The rod-like synthetic silica glass used in the present invention may be those each having a square, rectangular, circular or elliptic cross section, but those having circular cross sections are preferably used since it makes the operations easy. In the present invention, the rod-like synthetic silica glass material having a circular cross section means those each having an elliptic or circular cross section irrespective of fine irregularity of the contours thereof, but the silica glass material preferably has a circular cross section because it makes operations easy.

The massive formed article of synthetic silica glass according to the present invention may have a cross section such as a square having rounded corners or circle, a rectangle having rounded corners or ellipse, or a twisted form having an irregular periphery and the massive formed article has a side face, a part of which is externarily projected from the outlines of the end faces formed at both ends thereof, i.e., a part of which is expanded. However, the massive formed article is preferably in a spherical shape except for the cut surfaces formed when the article is cut away from the support rods because it makes operations easy.

The spherical massive formed article of synthetic silica glass according to the present invention means a massive formed article having an elliptic or spherical side face between both of the end faces, with those having spherical surface such as ball-like or spherical articles being preferred because of easiness of operations.

In the present invention, a rod-like synthetic silica glass is used as a rod-like synthetic silica glass material to be homogenized for the preparation of a highly homogeneous silica glass formed article for optical use, since the rod-like synthetic silica glass has high purity, has a low content of impurities, in particular, metallic impurities, high UV-transmittance and is excellent in resistance to ultraviolet irradiation.

Such a rod-like synthetic silica glass to be homogenized may be a directly synthesized silica glass ingot produced by flame-hydrolyzing a volatile silicon compound such as silicon tetrachloride, methyl trichlorosilane, methyl trimethoxysilane or tetramethoxy silane and depositing the resulting fine particles of silica on a rotating substrate while melting the deposited particles, or may be a synthetic silica glass ingot produced according to the soot method which comprises flame-hydrolyzing the aforementioned volatile silicon compound, depositing the resulting fine particles of silica on a rotating substrate and then melting, with heating, the resulting porous silica ingot into a transparent silica ingot.

The highly homogeneous rod-like formed article of synthetic silica glass for optical use produced according to the method of the present invention is homogeneous in three directions perpendicular to one another and has optical properties suitable as a material for use in making silica glass formed article for optical use which is used for the preparation of optical synthetic silica glass parts for ultraviolet rays.

To this end, the method for producing a highly homogeneous synthetic silica glass formed article for optical use according to the present invention includes a final forming step which comprises heating and molding the rod-like formed article of synthetic silica glass produced by the method for producing a highly homogeneous rod-like formed article of synthetic silica glass for optical use and homogeneous in the three directions in a mold; and then heating and gradually cooling the molded article to form a synthetic silica glass formed article for optical use which is homogeneous and free of any strain in the three directions perpendicular to one another.

Therefore, in the present invention, the highly homogeneous rod-like formed article of synthetic silica glass for optical use which is homogeneous and free of any cord in three directions perpendicular to one another is produced by homogenizing a heterogeneous rod-like silica glass material; then forming it into a high purity massive formed article of synthetic silica glass having end faces at both sides thereof, a side face positioned between the end faces, at least a part of which is externally projected beyond the outlines of the end faces and an optical homogeneity in the direction perpendicular to the line connecting the end faces lower than that of the article observed in the direction along the line connecting the end faces; forming the high purity massive formed article of synthetic silica glass into a rod-like synthetic silica glass having an optical homogeneity in the direction along the line connecting the end faces lower than that of the article observed in the direction perpendicular to the line connecting the end faces to homogenize the rod-like synthetic silica glass in the direction along which the synthetic silica glass has low optical homogeneity.

In this way, the present invention permits the easy production of a rod-like synthetic silica glass which is highly homogeneous and free of any cord in the three directions perpendicular to one another, starting from, for instance, a rod-like synthetic silica glass material having planar and/or complicated cords by, in particular, carrying out a step for forming the foregoing high purity massive formed article of synthetic silica glass in the middle of the production process, i.e., by processing the heterogeneous rod-like synthetic silica glass through the step for forming the high purity massive formed article of synthetic silica glass.

In particular, the present invention permits the easy production of a highly homogeneous rod-like formed article of synthetic silica glass for optical use, through the formation of such a high purity massive formed article of synthetic silica glass, without using, for instance, a graphite mold for molding, i.e., through a non-contact process.

In the present invention, the homogenization of the rod-like synthetic silica glass in the direction perpendicular to the longitudinal axis of the rod-like silica glass is performed, in a homogenization step, for instance, the first homogenization step, by supporting both ends of a rod-like synthetic silica glass, twisting the silica glass or expanding and contracting a molten zone of the silica glass rod while twisting the rod, in the air. The homogenization in this homogenization step is performed through a boundary area which is formed by applying, to the rod-like synthetic silica glass, an external force such as a twisting force, a drawing force or a compressive force to thus form portions, within the molten zone, which have different stresses or undergo different motions accompanied by a shearing effect or expansion and contraction effects.

The boundary area appears within the molten zone in the form of a streak, as disclosed in, for instance, DEOS No. 3,201,777 A1.

In the present invention, the boundary area can be formed within the molten zone by rotating the rod-like synthetic silica glass, in which the molten zone is formed, in different manners. For instance, the boundary area can be formed by rotating one of the ends of the rod-like synthetic silica glass, in which the molten zone is formed, while rotating the other end in the opposite direction or remaining it at rest; or rotating both of the ends in the same direction, but at substantially different numbers of revolutions. However, it is preferred to rotate these ends in opposite directions, since a boundary area can easily be formed within the molten zone in the form of a streak and the homogenization of the silica glass rod can relatively easily be performed. If one end of the molten zone is rotated and the other end thereof is rotated in the same direction, but at a different number of revolutions or remains at rest, the range which is under the influence of the shearing stress is broadened. Therefore, any streak-like boundary area is not formed unlike the case where the ends are rotated in the opposite directions, a boundary area is formed over the entire molten zone and the homogenization gradually proceeds. For this reason, a single homogenization step is insufficient for the homogenization of the silica glass rod in the plane perpendicular to the rotation axis and thus it is necessary to repeatedly carry out the homogenization step over several times.

In the present invention, if both ends of the rod-like silica glass are rotated in opposite directions, the ends thereof are preferably rotated at different numbers of revolutions since this makes operations easy. In this case, for instance, it is preferred to set the number of revolutions of the end on the side towards which a burner moves at 20 to 100 rpm, while rotating the other end at a number of revolutions of 1 to 3 times the number of revolutions of the former. The end positioned on the side towards which a burner moves is not necessarily rotated at a low number of revolutions, but this makes operations easy and thus is preferably adopted. The number of revolutions of the end which is slowly rotated preferably ranges from 20 to 50 rpm since the homogenization operation can easily be carried out.

The rod-like synthetic silica glass of the present invention has optical homogeneity in the longitudinal direction, i.e., the number of cords, per unit area, detected by the strain detector while arranging the silica glass rod in such a manner that the light rays for inspection are transmitted therethrough in the longitudinal direction, which is different from the optical homogeneity in the direction perpendicular to the longitudinal direction, i.e., the number of cords per unit area, detected by the strain detector while arranging the silica glass rod in such a manner that the light rays for inspection are transmitted therethrough in the direction perpendicular to the longitudinal direction.

More specifically, the optical homogeneity of the rod-like synthetic silica glass in the longitudinal direction is substantially greater than that observed for the silica glass rod in the direction perpendicular to the longitudinal direction. Therefore, if the rod-like synthetic silica glass has sufficiently high optical homogeneity in the longitudinal direction, the initial homogenization treatment for the silica glass rod in the longitudinal direction can be omitted. In other words, the rod-like synthetic silica glass is pressed in such a manner that the silica glass rod is compressed in the longitudinal direction while both of the ends thereof are rotated in the same direction and at different numbers of revolutions to give a massive formed article of synthetic silica glass.

In the present invention, the homogenization of the rod-like synthetic silica glass performed through the treatment of the boundary area formed by rotating the silica glass rod, in the first homogenization step, permits the homogenization thereof within the plane perpendicular to the first longitudinal axis, but does not permit the homogenization thereof within the plane parallel to the first axis. Therefore, when the optical homogeneity of the rod-like silica glass is determined by a strain detector or an interferometer, the rod-like silica glass has a number of cords detected in the direction along the first axis smaller than that detected in the direction perpendicular to the first axis.

Therefore, it is necessary to carry out a second homogenization treatment while making use of a second rotation axis perpendicular to the first axis to thus homogenize the rod-like synthetic silica glass in the plane perpendicular to the second axis in order to obtain a rod-like formed article of silica glass homogeneous in three directions perpendicular to one another.

In the homogenization treatment of the present invention, a mixing treatment is carried out to mix synthetic silica glass components and to eliminate cords within the plane perpendicular to the rotation axis of the rod-like synthetic silica glass, i.e., within the plane in the direction of the diameter thereof. For instance, planar curved cords of the rod-like synthetic silica glass formed in a layer pattern in the direction of the longitudinal rotation axis (the curved cords being arranged in a layer pattern, for instance, in the longitudinal direction) are converted into planar cords, parallel to one another, in the direction of, for instance, the diameter of the silica glass rod.

In the first and second homogenization treatments of the present invention, a boundary area is formed by applying an external force to the molten zone of the rod-like synthetic silica glass to thus generate a stress therein. The external force induces the formation of a boundary area within the molten zone partially formed in the rod-like synthetic silica glass and the rod-like silica glass is actively mixed in the boundary area. This active mixing can be ensured by rotating one end of the silica glass rod relative to the other end thereof to thus twist the rod through the action of the rotational force. In this case, it is effective to rotate one end of the rod-like synthetic silica glass relative to the other end thereof while reciprocating the other end in the direction of the rotation axis of the rod relative to the former end.

According to the present invention, more precise homogenization of the rod-like synthetic silica glass within the plane along the rotation axis of the silica glass rod can be ensured by heating, in the air, the rod-like synthetic silica glass which is provided with support members, such as support rods or support blocks, secured to both of the longitudinal edges thereof while rotating the support members to partially form a molten zone in the rod-like silica glass, applying an external force to the molten zone through the support members to form a boundary area within the molten zone, moving the boundary area of the molten zone along the rotation axis of the rod-like silica glass, and repeating these steps for homogenizing the rod-like synthetic silica glass in the plane crossing the rotation axis of the rod, for instance, perpendicular to or approximately perpendicular to the rotation axis, over a plurality of times.

The high purity massive formed article of synthetic silica glass according to the present invention has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces and the massive formed article is produced from heterogeneous rod-like synthetic silica glass.

In other words, the foregoing high purity massive formed article of synthetic silica glass according to the present invention is prepared by a method which comprises securing support members to longitudinal edges of a heterogeneous rod-like synthetic silica glass; heating the rod-like synthetic silica glass while rotating the support members in the air to molten a part of the silica glass rod and to thus form a molten zone; applying an external force to the molten zone through the support members to form a boundary area within the molten zone; moving the boundary area of the molten zone along the rotation axis of the silica glass rod so that the synthetic silica glass rod has an optical homogeneity in the plane perpendicular to the rotation axis of the silica glass rod higher than that observed in the plane parallel to the rotation axis; rotating the rod-like synthetic silica glass, whose optical homogeneity in the plane perpendicular to the rotation axis is higher than that observed in the plane parallel to the rotation axis, through the rotation of the support members to partially form a molten zone in the rod-like synthetic silica glass; pressing the rod-like synthetic silica glass, a part of which is molten to form the molten zone and which is rotated, in the air, along the direction of the rotation axis through the support members to thus deform the molten zone of the rod-like synthetic silica glass without impairing the homogeneity thereof and to form a massive formed article of synthetic silica glass; and cutting the massive formed article formed in the air, i.e., in a non-contact manner away from the support members.

Such homogenization and forming treatments in the present invention comprises, for instance, fitting heterogeneous rod-like synthetic silica glass to support members held by rotary chucks of a silica glass-processing lathe; softening a part of the rod-like synthetic silica glass with heating while rotating the silica glass rod in the air by the foregoing lathe to partially form a molten zone in the silica glass rod; forming a boundary area in the molten zone by rotating the rotary chucks in opposite directions; moving a heating means, which is in general a burner, along the entire length of the silica glass rod to thereby form rod-like synthetic silica glass having an optical homogeneity in the plane perpendicular to the rotation axis higher than that observed in the plane parallel to the rotation axis; then subjecting the silica glass rod to a forming step comprising fitting the rod-like synthetic silica glass, whose optical homogeneity in the plane perpendicular to the rotation axis is higher than that observed in the plane parallel to the rotation axis, to support members held by rotary chucks of a silica glass-processing lathe; softening a part of the rod-like synthetic silica glass with heating while rotating the silica glass rod in the air by the action of the foregoing lathe to partially form a molten zone in the silica glass rod; moving either or both of the rotary chucks of the lathe so that the distance between these chucks is narrowed to press and deform the molten zone of the silica glass rod in the air, and simultaneously gradually moving a heating means, which is in general a burner, along the rotation axis so that the distance between these chucks is narrowed to thereby form massive synthetic silica glass in the air; then cutting the massive synthetic silica glass away from the support members to give end faces and to thus form a high purity massive formed article of synthetic silica glass having a side face positioned between the end faces, at least a part of which is externally projected beyond the outlines of the end faces and an optical homogeneity in the direction perpendicular to the line connecting the end faces lower than that observed in the direction along the line connecting the end faces.

The silica glass-processing lathe usable in the present invention may be one disclosed in, for instance, DEOS No. 3,201,777 A1 which is equipped with rotary chucks each rotatably connected to a motor and arranged at opposite positions and a heating means such as a burner movably positioned between the rotary chucks.

In the present invention, the heating of the rod-like synthetic silica glass or the massive formed article of synthetic silica glass is performed by moving a heating means such as a burner, a cylindrical heater or an induction furnace in the direction along the rotation axis of the silica glass rod or massive formed article.

In the first homogenization treatment used in the present invention, the rod-like synthetic silica glass is homogenized in the plane parallel to the first direction crossing the first axis serving as the rotation axis for the first homogenization, but it is difficult to homogenized the silica glass rod in the plane parallel to the rotation axis. For this reason, it is necessary to perform homogenization in the plane along a second direction crossing the first direction (for instance, homogenization in the second homogenization treatment) in addition to the first homogenization treatment (for instance, homogenization in the first homogenization treatment). In the present invention, a further homogenization treatment is thus carried out while establishing a second axis crossing the first axis.

In the present invention, the homogenization in the second homogenization step must be performed using a rotation axis crossing the rotation axis used in the first homogenization step, for instance, a rotation axis perpendicular to the first axis. Therefore, the rod-like synthetic silica glass homogenized in the first direction in the first homogenization step is once formed into a massive formed article without impairing the homogeneity of the silica glass rod in the first direction and then the massive formed article of synthetic silica glass is drawn into a rod-like synthetic silica glass material. The massive formed article of synthetic silica glass is formed into the rod-like synthetic silica glass while rotating the massive formed article in the longitudinal direction of the rod-like silica glass which serves as the rotation axis in the second homogenization treatment and is perpendicular to the rotation axis in the first homogenization treatment. Therefore, this step is performed in such a manner that the homogeneity achieved by the first homogenization treatment like the formation of the massive formed article.

In the present invention, the end faces are formed by, for instance, cutting through melting or cutting the massive formed article of synthetic silica glass away from the support rods, the end faces each has a clear contour serving as the boundary between the end face and the side face and may have various shapes.

In the present invention, the high purity massive formed article of synthetic silica glass has end faces at both sides thereof, a side face positioned between the end faces, at least a part of which is externally projected beyond the outlines of the end faces, and an optical homogeneity in the direction perpendicular to the line connecting the end faces lower than that observed in the direction parallel to the line connecting the end faces. The relation between these optical homogeneities can be confirmed by examining, using a strain detector or an interferometer, the massive formed article of synthetic silica glass on whether, or not, the number of cords, per unit area, observed when the light rays for inspection are transmitted therethrough in the direction perpendicular to the line connecting the end faces is substantially smaller than the number of cords, per unit area, observed when the light rays for inspection are transmitted therethrough in the direction parallel to the line connecting the end faces.

Therefore, the forming step used in the present invention comprises deforming, under pressure, a rod-like synthetic silica glass into a massive formed article through the processing of the molten zone formed within the rod-like synthetic silica glass; or drawing a massive formed article of synthetic silica glass into a rod-like synthetic silica glass material.

Thus, in the present invention, the molten zone is formed by softening, under heating, synthetic silica glass having a value: log $\eta$ of not more than 8 (wherein $\eta$ means the viscosity (poise) of the synthetic silica glass) in order to simplify the homogenization or molding of such a rod-like synthetic silica glass, molding of the rod-like synthetic silica glass into a massive formed article of synthetic silica glass or drawing of the massive formed article of synthetic silica glass into rod-like synthetic silica glass. However, the value: log $\eta$ is preferably not more than 5 because this makes operations easy.

In the present invention, the rod-like formed article of synthetic silica glass for optical use having optical homogeneity in three directions perpendicular to one another is prepared from this high purity massive formed article of synthetic silica glass.

More specifically, the present invention permits the production of the rod-like formed article of synthetic silica glass for optical use having optical homogeneity in the three directions perpendicular to one another by fitting support members such as support rods to opposite two edge portions on the side face of the high purity massive formed article of synthetic silica glass; heating the high purity massive formed article while rotating it through the rotational action of the support members in the air to form a molten zone in the massive formed article; drawing the molten zone in the massive formed article by outwardly pulling the support members in the axial direction in the air to form a rod-like synthetic silica glass material; heating the rod-like synthetic silica glass thus formed while rotating it, in the air, through the rotational motion of the support members to partially form a molten zone within the rod-like synthetic silica glass; applying an external force to the molten zone through the support members to induce the formation of a boundary area in the molten zone; moving the boundary area in the molten zone along the rotation axis of the rod-like synthetic silica glass to thus produce the intended article while preventing any contamination of the article through the contact with, for instance, a mold for fabrication as low as possible, i.e., keeping the surface of the article in a non-contact condition.

In the present invention, to impart a highly improved homogeneity to the highly homogeneous rod-like formed article of synthetic silica glass as a final product, the outer diameter of the rod-like synthetic silica glass processed in the first and/or second homogenization steps such as that of the rod-like synthetic silica glass having a circular cross section preferably ranges from 40 to 150 mm. This limitation also makes the operations easy and results in the reduction of the working time required. Moreover, the variation in the outer diameter should be not more than 10%, preferably not more than 3% and more preferably not more than 1% or 1 mm. This is preferred for the improvement in the homogeneity of the resulting article. This is because if the outer diameter exceeds 150 mm, it is difficult to obtain a highly homogeneous rod-like formed article of synthetic silica glass due to a temperature difference caused between the outer periphery and the central portion thereof, while if it is less than 40 mm, operations such as heating are easy, but it has poor practical utility because of its small size.

According to a preferred embodiment of the present invention, both ends of the rod-like synthetic silica glass are rotated in the same direction at different numbers of revolutions such that a slight twist is induced in the rod-like synthetic silica glass on a silica glass-processing lathe prior to the homogenization step, for instance, the first or second homogenization step and at the same time, softening portions having large outer diameters with heating while drawing the rod-like synthetic silica glass till the outer diameter thereof reaches a desired level to thus obtain rod-like synthetic silica glass having such a shape. Moreover, portions having small outer diameters are, on the contrary, preferably heated and pressed till the outer diameter thereof reaches a desired level. In particular, the addition of such an operation for shape-control to the second forming step prior to the second homogenization treatment is preferred to obtain rod-like synthetic silica glass having a circular cross section of a desired outer diameter.

The outer diameter of the rod-like synthetic silica glass can be limited to 40 to 150 mm and the variation in the outer diameter thereof can be limited to not more than 3%, in particular not more than 1%, through the control of the outer diameter thereof in this manner.

According to the present invention, the homogenization of rod-like synthetic silica glass in the plane crossing the rotation axis thereof can more precisely be carried out, along the rotation axis thereof through the homogenization step, for instance, the first and/or second homogenization steps which comprise securing support members such as support rods to the longitudinal ends of the rod-like synthetic silica glass; heating the silica glass rod while rotating the support members in the air to partially form a molten zone in the rod; applying an external force to the molten zone through the support members to induce the formation of a boundary area in the molten zone; moving the boundary area in the molten zone along the rotation axis of the rod-like synthetic silica glass to thus produce rod-like synthetic silica glass having a homogeneity in the plane perpendicular to the rotation axis of the rod higher than those for observed in other planes; and repeating the foregoing homogenization operations over several times.

In the first forming step for forming rod-like synthetic silica glass into a massive synthetic silica glass used in the method of the present invention, it is needed to form a massive formed article of synthetic silica glass such as spherical formed article without impairing the cords arranged by the first homogenization step within the planes in the direction of the diameter of the rod-like synthetic silica glass.

Accordingly, in the present invention, the rod-like synthetic silica glass which has been processed in the first homogenization step is softened with heating, while synchronously rotating the rod through the rotation of, for instance, right and left chucks of a silica glass-processing lathe to thus partially form a molten zone and then slightly changing the numbers of revolutions of these chucks, i.e., establishing a slight difference in rotation between the right and left chucks to prevent any movement of the axis of the rod-like synthetic silica glass. The prevention of this movement of the axis permits the deformation of the rod in such a manner that the rod is compressed while holding the directions of the planes of cords perpendicular to the rotation axis, when deforming, under pressure, the molten zone of the rod-like synthetic silica glass by moving at least one of the chucks along the rotation axis such that the distance between these chucks is reduced.

When the right and left chucks are rotated in the same direction at different numbers of revolutions, the difference in the numbers of revolutions is selected in such a manner that the number of revolutions of the chuck rotating at a low speed is generally 4% to 36% lower than that of the chuck rotating at a high speed, but preferably the number of revolutions of the former is 4% to 18% lower than that of the latter. For instance, when the number of revolutions of the former is set at 28 rpm, that of the latter ranges from 27 to 18 rpm, preferably 27 to 23 rpm.

According to the present invention, the difference in the number of revolutions between the right and left chucks permits the control of the movement of the rotation axis of the rod-like synthetic silica glass. On the other hand, the force required for establishing a desired difference in the number of revolutions such as a torque applied to the support rods increases after at least 60%, preferably on the order of 80% of the massive formed article of synthetic silica glass is formed and the rotation axis is stabilized. This is conspicuous, in particular, at the initial and middle stages of the forming step. For this reason, preferably the difference in the number of revolutions is reduced and the chucks are synchronously rotated after the formation of the massive formed article is completed.

In the first forming step used in the present invention, the rod-like synthetic silica glass which has been homogenized in the first homogenization step is formed into a massive formed article of synthetic silica glass such as a spherical formed article of synthetic silica glass by rotating the right and left chucks in the same direction while establishing a difference in the number of revolutions therebetween; moving, for instance, a burner, a cylindrical heater or an induction heater towards the direction along which the deformation of the rod proceeds under compression; and moving, in order, the molten zone formed through the softening with heating towards the direction along which the deformation of the rod proceeds under compression to thus compress and deform the rod in the direction along the rotation axis of the first homogenization step. The synthetic silica glass formed into an article having a spherical shape is removed from the support members and then support members are fitted to both edges on the side of the massive formed article of synthetic silica glass in the direction crossing the rotation axis for the first homogenization step.

The homogenization in the second homogenization step can be accomplished even if the direction of the support members fitted to the side face of the massive formed article of synthetic silica glass and the direction of the rotation axis for the first homogenization step makes only a small angle, but these directions preferably cross each other at an angle of not less than 45°. More preferably, the direction of the support members and that of the rotation axis for the first homogenization step cross each other at an angle of about 90 because operations are relatively easy and an intended product having a high homogeneity can be obtained.

The second forming step comprises synchronously rotating support rods secured to both ends of a spherical synthetic silica glass material; heating the glass material by, for instance, a burner, a cylindrical heater or an induction heater; drawing the support members in the direction along the rotation axis in such a manner that the distance therebetween increases; moving a heating means such as a burner in the direction of the rotation axis in such a manner that the glass material is drawn from one direction to thus soften the glass material under heating; and drawing the glass material till the spherical silica glass is drawn into rod-like synthetic silica glass having a desired outer diameter.

In the present invention, the synthetic silica glass formed article for optical use which is homogeneous and free of any strain in the three directions perpendicular to one another, i.e., the highly homogeneous synthetic silica glass formed article for optical use is formed by, for instance, molding the rod-like formed article of synthetic silica glass for optical use which is homogeneous in three directions perpendicular to one another into a formed article having a variety of shapes such as cubes, rectangular columns and discs in a graphite mold as in the conventional methods. Strong thermal strains are present in the synthetic silica glass formed articles thus formed into various shapes and accordingly, the articles are subsequently subjected to heating and gradual cooling treatments.

This heating-gradual cooling treatment is performed to remove the thermal strains present in the formed article and comprises heating the formed article up to a temperature equal to or higher than the gradual cooling point in an electric furnace and then gradually cooling at a slow cooling velocity of not more than −5° C./hr.

In the present invention, the highly homogeneous synthetic silica glass formed article for optical use is used as a raw material for preparing synthetic silica glass optical parts for ultraviolet rays.

According to the present invention, a highly homogeneous rod-like formed article of synthetic silica glass which is homogeneous and free of any cord in the three directions perpendicular to one another can be formed, in the air, without using any mold, starting from heterogeneous high purity massive formed article of synthetic silica glass without coming in contact with any mold, i.e., without any contamination due to contact with a mold and through a novel high purity massive formed article of synthetic silica glass having end faces at both sides thereof, a side face positioned between the end faces, at least a part of which is externally projected beyond the outlines of the end faces and an optical homogeneity in the direction perpendicular to the line connecting the end faces lower than that observed in the direction along the line connecting the end faces, as an intermediate.

According to the present invention, a highly homogeneous rod-like formed article of synthetic silica glass which is homogeneous and free of any cord in the three directions perpendicular to one another can easily be formed in the air in a non-contact manner while using, as a starting material, a novel high purity massive formed article of synthetic silica glass having end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces. Therefore, any contamination which may be caused through the contact with a graphite mold during molding can be eliminated.

According to the present invention, a highly homogeneous rod-like formed article of synthetic silica glass is prepared by heating rod-like synthetic silica glass in the air while rotating support members for the silica glass rod to form a molten zone; applying an external force to the molten zone to induce the formation of a boundary area; moving the boundary area along the rotation axis of the silica glass rod to give a silica glass rod having a homogeneity in the plane perpendicular to the rotation axis of the silica glass rod higher than that observed in the plane parallel to the rotation axis; forming a molten zone while rotating the silica glass rod which has been homogenized in the direction of the diameter thereof and at the same time, compressing the rod along the rotation axis in the air to form a massive synthetic silica glass material; cutting the massive silica glass material away from the support members to form a massive formed article of synthetic silica glass having end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces; fitting support members such as support rods to both edges on the side face of the massive formed article; heating the massive formed article while rotating the article through the action of the support members in the air to form a molten zone; outwardly drawing at least one of the support members fitted to the massive formed article in the direction along the rotation axis to draw the massive formed article into a rod-like product and to thus give a rod-like synthetic silica glass material; heating the silica glass rod in the air while rotating the support members fitted to the silica glass rod to give a molten zone; applying an external force to the molten zone to form a boundary area; and moving the boundary area along the rotation axis of the silica glass rod to give a rod-like synthetic silica glass material homogeneous in the three directions perpendicular to one another and a formed article of synthetic silica glass which is homogeneous and free of any strain in the three directions perpendicular to one another is produced starting from the highly homogeneous rod-like formed article of synthetic silica glass for optical use thus prepared. More specifically, the present invention permits easy production of a highly homogeneous formed article of synthetic silica glass which is suitable as a raw material for making silica glass optical parts used in the high precision photolithography and having optical characteristics stable over a long time period, starting from a high purity synthetic silica glass ingot produced according to, for instance, the direct or soot method.

The formed article of synthetic silica glass according to the present invention which is produced by forming, under heating, the highly homogeneous rod-like formed article of synthetic silica glass for optical use and then heating and gradually cooling the formed product is highly homogeneous and free of any cord in the three directions perpendicular to one another, shows good transmittance to ultraviolet rays such as light rays emitted from an excimer laser, does not emit any fluorescent light rays upon irradiation with ultraviolet rays and can be used in high precision photolithography device having optical characteristics stable over a long time period.

In the present invention, the homogenization and formation operations are carried out in the air, i.e., in a non-contact manner in which the material does not come in contact with contaminants such as a graphite mold, thus any contamination through the contact with contaminants such as a graphite mold can be eliminated. Therefore, the present invention permits the production of a highly homogeneous formed article of synthetic silica glass having a refractive index distribution, as determined using, for instance, light rays having a wavelength of 633 nm, of not more than $\pm 1 \times 10^{-6}$ as expressed in terms of $\Delta n$ and a high transmittance to light rays falling within the ultraviolet region, for instance, an internal transmittance of not less than 99.9% as determined using light rays having a wavelength of 248 nm and an optical path length of 1 cm.

According to the present invention, a massive formed article of synthetic silica glass having heterogeneity in one direction can be prepared in the course of the preparation procedures and the massive formed article can be homogenized by drawing it into a rod-like product at any proper place to give a rod-like formed article of synthetic silica glass. Thus, any appropriate steps can be added to the production procedures depending on the applications thereof and various kinds of highly homogeneous formed articles of synthetic silica glass can be prepared.

BRIEF DESCRIPTION OF THE DRAWINGS

Embodiments of the present invention will hereunder be explained with reference to the attached drawings, but the present invention is by no means limited by the following description and embodiments.

FIG. 1 is a diagram for illustrating schematic arrangement of, for instance, tools for supporting rod-like synthetic silica glass and a burner used in the first step for homogenizing the silica glass rod; FIG. 2 is a diagram for schematically illustrating the relation between cords and the rotation axis of the silica glass rod which has been homogenized in the first homogenization step, i.e., the homogenization step shown in FIG. 1; FIG. 3 is a diagram for schematically illustrating the relation between cords and the rotation axis of a ball-shaped synthetic silica glass material in the first forming step for producing such a ball-shaped synthetic silica glass material by pressing the rod-like synthetic silica glass shown in FIG. 2 in the direction along the rotation axis; FIG. 4 is a diagram for schematically illustrating the relation between cords and the rotation axis of the ball-shaped synthetic silica glass shown in FIG. 3 at the stage when the positions of the silica glass to be secured are changed; and FIG. 5 is a diagram for schematically illustrating the relation between cords and the rotation axis at the stage in which the ball-shaped synthetic silica glass shown in FIG. 4 whose positions to be secured have been changed is drawn in the direction along the changed holding positions.

In FIG. 16, the wavelength is plotted as abscissa and the apparent transmittance (%) as ordinate.

Figure 1:
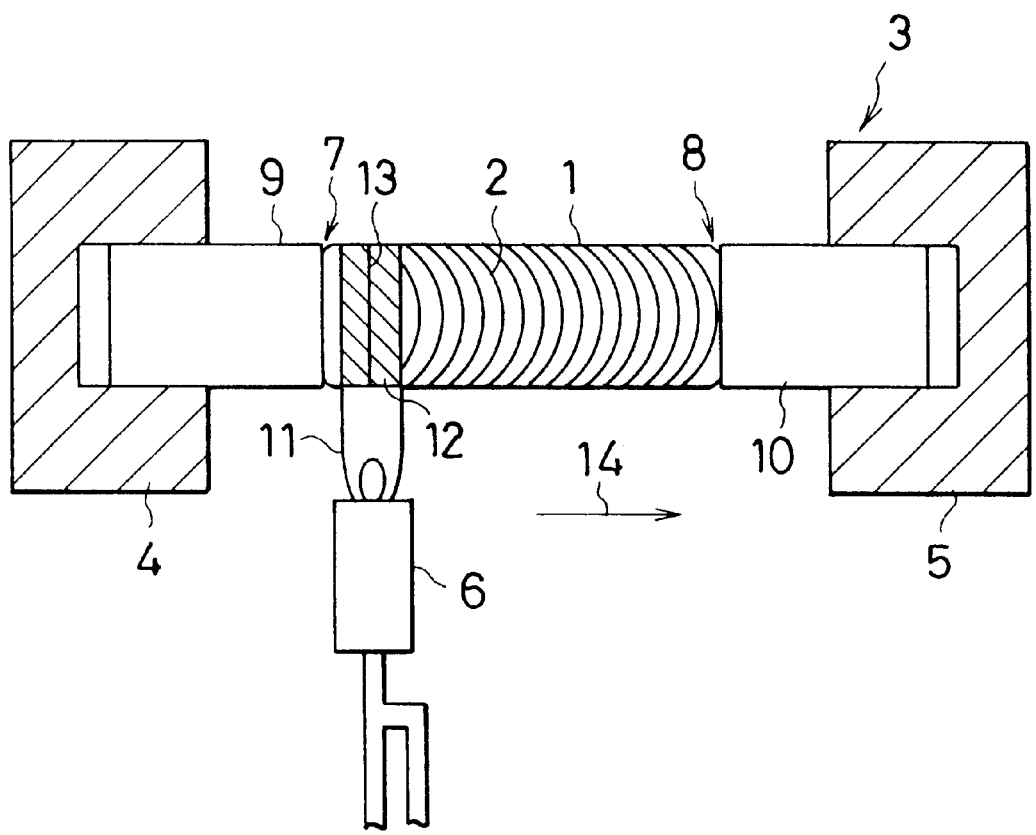
FIGS. 1 to 5 are diagrams for explaining steps for homogenizing and forming synthetic silica glass in one embodiment according to the present invention.

An Embodiment of the production method of the present invention will specifically be described below on the basis of FIGS. 1 to 5.

DESCRIPTION OF THE PREFERRED EMBODIMENTS

According to the present invention, a novel high purity massive formed article having end faces at both sides thereof, a side face positioned between the end faces, at least a part of which is externally projected beyond the outlines of the end faces and an optical homogeneity in the direction perpendicular to the line connecting the end faces lower than that of the article observed in the direction along the line connecting the end faces is formed and the massive formed article as a raw material is molded in the air, i.e., under the condition free of contact with any mold. Accordingly, the present invention easily permits the formation of a silica glass formed article for optical use, starting from a heterogeneous high purity rod-like synthetic silica glass material, which has impurity contents, due to the contact with a mold, lower than those observed for the article prepared by the conventional methods, which is free of any cord in the three direction perpendicular to one another, i.e., highly homogeneous in the three directions, which has high purity and a high transmittance to ultraviolet rays and which is stable to light rays emitted from an excimer laser.

According to the present invention, a highly homogeneous rod-like formed article of synthetic silica glass for optical use is produced by heating, in the air, a heterogeneous rod-like synthetic silica glass material while rotating rods for supporting the silica glass rod to form a molten zone; applying an external force to the molten zone to form a boundary area; moving the boundary area along the rotation axis of the silica glass rod to form a silica glass rod having a homogeneity in the direction of the diameter thereof higher than that observed along the rotation axis; rotating the silica glass rod which is homogenized in the direction of the diameter thereof and forming a molten zone, while compressing the rod in the direction along the rotation axis to give a massive synthetic silica glass material in the air; cutting the massive silica glass material away from support members to form a massive formed article of synthetic silica glass material which has end faces at both sides thereof, a side face positioned between the end faces, at least a part of which is externally projected beyond the outlines of the end faces, and an optical homogeneity in the direction perpendicular to the line connecting the end faces lower than that observed in the direction along the line connecting the end faces; fixing support rods to both ends on the side of the massive formed article of synthetic silica glass; heating the massive formed article in the air while rotating the formed article through the support rods to form a molten zone; drawing the massive formed article into a rod-like shape by outwardly drawing at least one end of the article towards the direction along the rotation axis thereof to give a rod-like synthetic silica glass material whose end faces are formed from the side face of the massive formed article of synthetic silica glass; heating, in the air, the rod-like silica glass while rotating support rods secured to the silica glass rod to give a molten zone; applying an external force to the molten zone to form a boundary area; and moving the boundary area along the rotation axis of the silica glass rod to thus homogenize the silica glass rod in the three directions perpendicular to one another. Accordingly, the present invention easily permits the production of a synthetic silica glass raw material which cannot be produced by the conventional methods for preparing silica glass formed articles, which is highly homogeneous and free of cord in the three directions perpendicular to one another, which has a high transmittance to ultraviolet rays such as those emitted from excimer lasers, which never emits any fluorescent light rays when irradiated with ultraviolet rays and which is suitable for use in making silica glass optical parts for high precision photolithography which have optical characteristics stable over a long time period.

Moreover, in the present invention, a novel high purity massive formed article having end faces at both sides thereof, a side face positioned between the end faces, at least a part of which is externally projected beyond the outlines of the end faces and an optical homogeneity in the direction perpendicular to the line connecting the end faces lower than that of the article observed in the direction along the line connecting the end faces is formed and the massive formed article as a raw material is molded in the air, i.e., under the condition free of contact with any mold. Accordingly, the present invention permits the formation of a highly homogeneous rod-like formed article of synthetic silica glass at any proper place starting from the massive formed article of synthetic silica glass and further permits the completion of a variety of products of highly homogeneous formed article of synthetic silica glass while adding appropriate steps to the foregoing method depending on the applications thereof.

In FIG. 1, a synthetic silica glass rod 1 having cords such as a rod-like synthetic silica glass ingot is produced by the so-called method for preparing synthetic silica glass in which a volatile silicon compound such as silicon tetrachloride is used as an ingredient and in general has parabolic cords 2 originated from the growing plane formed during the production of the synthetic silica glass. In FIGS. 2 to 5, the cords 2 are schematically shown as fine lines within the synthetic silica glass rod 1.

A silica glass-processing lathe 3 used in this Embodiment is equipped with a chuck 4 on the fixed side and a chuck 5 on the movable side which are independently rotatable as well as a movable gas burner 6.

As shown in FIGS. 1–5, the synthetic silica glass rod 1 having a circular cross section is connected, through welding, at both ends 7 and 8, to support rods 9 and 10 of silica glass held by the chucks 4 and 5 of the silica glass-processing lathe 3 and then the synthetic silica glass rod 1 is held by the chucks 4 and 5 of the lathe 3 (FIG. 1).

The silica glass rod 1 held by the chucks 4 and 5 is partially heated by the fire flame 11 of the burner 6, while synchronously rotating the chucks 4 and 5 to form a molten zone 12 within the silica glass rod 1.

In this Embodiment, the heating means used was a gas burner which made use of a fuel gas such as hydrogen gas or propane gas. However, the heating means is not limited to a gas burner and may be an electric heating means such as a radio-frequency heating means. The burner heating is desired rather than the electric heating while taking into consideration the high purity of the resulting heating atmosphere.

After forming the molten zone within the synthetic silica glass rod 1, the rotational direction and the numbers of revolutions of the chucks 4 and 5 are adjusted by independently controlling the rotational motions of these chucks 4 and 5 of the silica glass-processing lath 3.

At this stage, the removal of the cords 2 and homogenization of the silica glass rod 1 are performed by inducing a stress within the molten zone 12 through the rotation of these chucks 4 and 5 in different directions at different numbers of revolutions to thus form a boundary area 13 and to admix the silica glass in the boundary area 13.

In order to make the mixing of the silica glass by the shearing stress in the boundary area 13 smooth, it is quite important that the heated portion of the interested synthetic silica glass rod 1 is sufficiently heated and softened. To this end, the temperature of the molten zone 12 must be not less than 2000° C.

Alternatively, in the homogenization of the silica glass rod in this embodiment, the rotation of the chucks 4 and 5 of the silica glass-processing lathe 3 may be the so-called differential rotation in which the chucks are rotated in the same direction, but at different numbers of revolutions or only one of these chucks 4 and 5 is rotated while the other chuck remains at rest. In addition, the right and left chucks 4 and 5 may be rotated in opposite directions.

Moreover, if the right and left chucks 4 and 5 are rotated, it is not necessary to rotate these chucks at the same number of revolutions and the number of revolutions thereof is desirably controlled depending on the direction 14 along which the burner moves.

Furthermore, the effect of mixing the synthetic silica glass within the molten zone 12 can be improved by rotating these right and left chucks 4 and 5 and at the same time, reciprocating these chucks 4 and 5 along the direction of the rotation axis.

The homogenization of the synthetic silica glass rod 1 in the direction of the diameter thereof and along the rotation axis thereof is carried out by rotating the right and left chucks 4 and 5 in different directions at different numbers of revolutions to homogenize the molten zone 12 and moving the molten zone 12 over the entire length of the silica glass rod 1 through the movement of the burner 6 along the direction of the rotation axis (first homogenization step).

Figure 2:
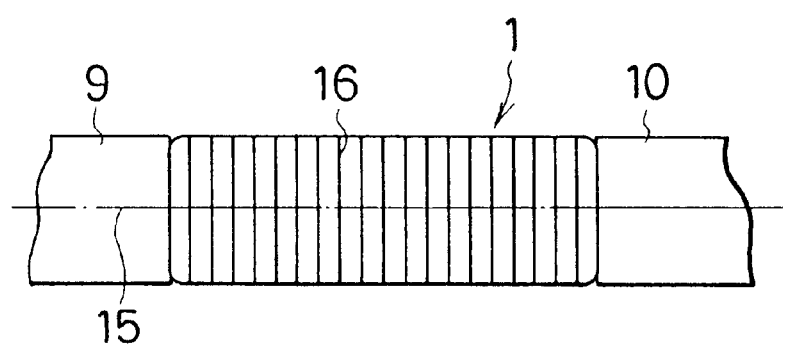

FIG. 2 schematically shows the presence of cords or the like in the synthetic silica glass rod 1 which has been subjected to the first homogenization treatment. After completion of the first homogenization, the curved planar cords 2 included in the synthetic silica glass rod 1 as a starting material is converted into planar cords 16 perpendicular to the first longitudinal axis of the silica glass rod 1, i.e., the first rotation axis 15 through the first homogenization treatment.

A plurality of planar cords 16 crossing the first longitudinal axis 15 of the silica glass rod 1 still remain in the synthetic silica glass rod 1 which has been subjected to the first homogenization treatment and thus the rod 1 is still heterogeneous in properties. To perform homogenization of the synthetic silica glass rod 1 in the direction different from the homogenization direction in the first homogenization step, the glass rod 1 which has been treated in the first homogenization step is heated and softened and simultaneously the chucks 4 and 5 of the silica glass-processing lathe 3 is rotated in the same direction at different numbers of revolutions while the silica glass rod 1 is compressed through the support rods 9 and 10 so that the distance between the chucks 4 and 5 is reduced to form a ball-like synthetic silica glass material 17 schematically shown in FIG. 3 (first forming step).

Figure 3:
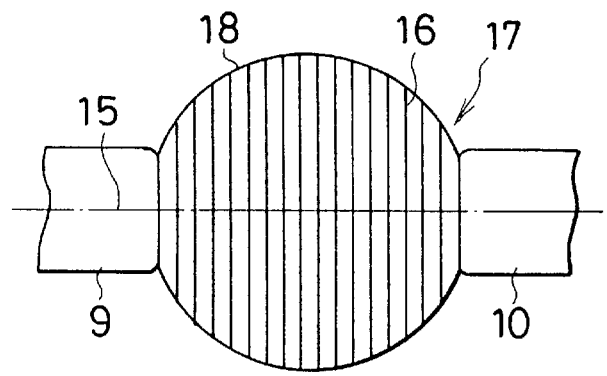

In this first forming step, the molten zone of the synthetic silica glass rod 1 comes in contact with only the fire flame of the burner and the rod can be formed within an atmosphere of very high purity. A ball-shaped synthetic silica glass material 17 having a ball-shaped side face 18 around the first axis is formed in the first forming step. The lateral axial line of the ball-shaped synthetic silica glass 17 is identical to the first rotation axis 15 of the silica glass rod 1 in the first homogenization step. The relation between the direction 15 of the ball-shaped silica glass 17 along the first rotation axis and the remaining planar cords 16 is schematically shown in FIG. 3.

Figure 4:
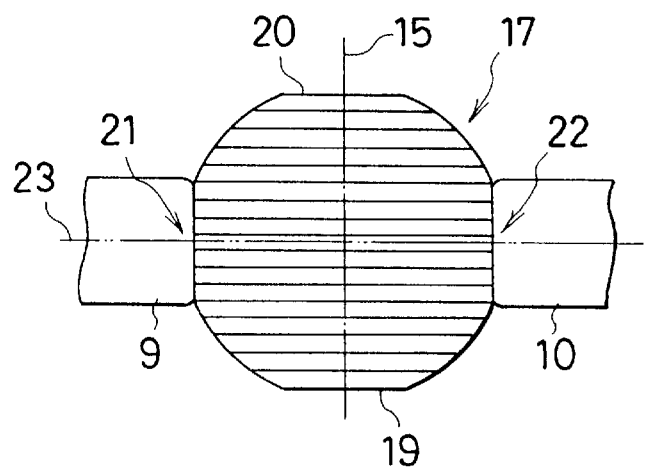
Figure 5:
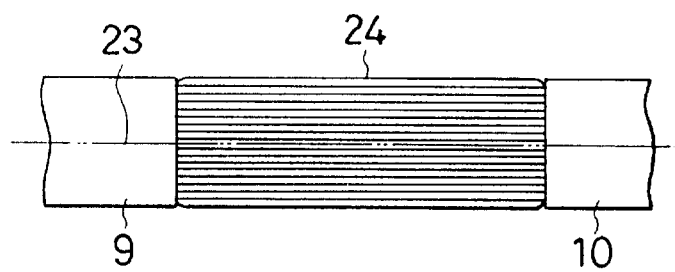

In this embodiment, the ball-shaped synthetic silica glass 17 is cut away from the support rods 9 and 10 (the step for cutting the ball-shaped synthetic silica glass). In this embodiment, the ball-shaped synthetic silica glass 17 thus cut away has two cut surfaces 19 and 20 at opposite positions on both sides of the ball-shaped silica glass. One (19) of the cut surfaces of the silica glass ball 17 is put on a support table (not shown) so as to face the cut surface 19 downward and the support rod 9 and 10 are connected to opposite positions 21 and 22 on the side face 18, respectively as schematically shown in FIG. 4. In this embodiment, the support rods 9 and 10 are connected while they face the direction approximately perpendicular to the first axis 15 (step for changing support positions).

In this step for changing the support positions, as shown in FIG. 4, the ball-shaped synthetic silica glass 17 is arranged so as to face the cut surfaces 19 and 20 upward and downward respectively. If the silica glass ball is arranged in such a manner, the direction along the line connecting horizontal side faces 21 and 22 of the silica glass ball 17 is parallel to the plane of the cord 16 and perpendicular to the foregoing first axis. Therefore, if the support rods 9 and 10 made of silica glass are connected, through welding, to the horizontal side faces 21 and 22 of the silica glass ball 17, a second rotation axis 23 can easily be established in a direction parallel to the plane of the cord 16.

The operation for securing the support rods to the silica glass ball 17 in the step for changing the support positions permits the establishment of the second axis 23 of the silica glass ball 17 so as to be parallel to the planes of the cords 16 which have been arranged in one direction.

After the support rods 9 and 10 held by the chucks of the silica glass-processing lathe are fitted to the horizontal side faces 21 and 22 of the silica glass ball 17, the whole of the silica glass ball 17 is softened through heating with a burner while synchronously rotating the support rods 9 and 10 and then drawn along the direction of the novel second axis 23 to give a synthetic silica glass rod 24 (second forming step).

In the second forming step of this embodiment, the outer diameter of the silica glass rod 24 is made uniform by compressing the portions of the rod 24 having a diameter smaller than the desired level through the action of the chucks or drawing the portions thereof having a diameter greater than the desired level through the action of the chucks, while rotating the chucks 4 and 5 of the silica glass-processing lathe in the same direction and at different numbers of revolutions. In this second forming step, the silica glass formed article comes in contact with only the fire flame of the burner, i.e., the formed article can be formed under non-contact conditions except for the contact with the flame. Thus, an environment of high purity can be maintained during the forming step.

The silica glass rod 24 produced in the second forming step is homogenized over the entire length thereof by forming a boundary area 13 within the molten zone 12 while rotating the chucks 4 and 5 in opposite directions like the first homogenization treatment for the silica glass rod 1 as shown in FIG. 1; moving the burner 6 along the rotation axis to thus move the boundary area 13 over the entire length of the silica glass rod 24 along the rotation axis of the rod 24 (second homogenization step).

The second homogenization step of this embodiment comprises forming a molten zone 12 by, for instance, heating; then inducing a shearing force in the molten zone 12 by rotating the right and left chucks 4 and 5 in opposite directions and at different numbers of revolutions through independently controlling these chucks 4 and 5 of the silica glass-processing lathe to thereby form a boundary area 13 within the molten zone 12 and to thus remove any cord and homogenize the silica glass rod 24. The second homogenization treatment permits the production of silica glass body which is homogenized in the directions along the first and second axes and which is homogeneous and free of any cord in the three directions perpendicular to one another, starting from the synthetic silica glass rod 1. Specific examples according to this embodiment will be given below.

EXAMPLE 1

A rod-like synthetic silica glass ingot was formed by flame-hydrolyzing silicon tetrachloride in an oxyhydrogen flame and depositing the resulting fine silica particles on a rotating substrate. The resulting rod-like silica glass ingot had a diameter of 60 mm, a length of 1000 mm and a weight of about 6 kg.

A piece having a length of 30 mm in the direction along the longitudinal axis was cut away from the edge of the resulting silica glass and faces each having a height of 55 mm and a length of 30 mm, which are parallel to the longitudinal direction, were formed at opposite positions on both of the curved side faces. The distance between the faces was set at 30 mm. The sample cut away from the rod-like silica glass ingot was observed using a Fizeau interferometer and a strain detector while transmitting light rays therethrough in the direction along the longitudinal axis and in the direction perpendicular to the longitudinal axis. The results thus obtained are shown in FIGS. 6 to 9.

Figure 6:
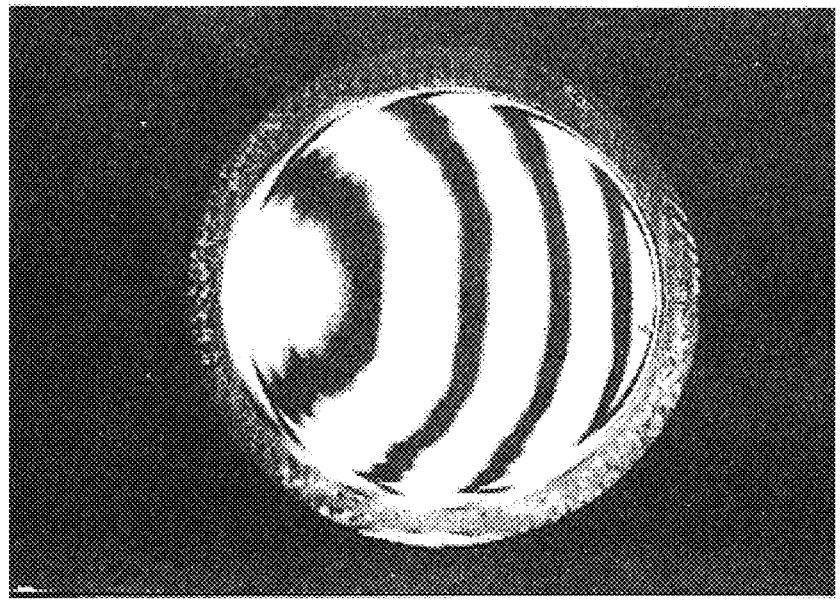
FIG. 6 is a photograph showing interference fringes observed when a rod-like synthetic silica glass ingot used in an Example of the present invention was examined by a Fizeau interferometer while transmitting light rays through the ingot along the longitudinal axis of the ingot and FIG. 7 is a photograph showing interference fringes observed when the rod-like synthetic silica glass ingot shown in FIG. 6 was examined by a Fizeau interferometer while transmitting light rays through the ingot in the direction perpendicular to the longitudinal axis of the ingot.

FIG. 6 is a photograph showing the interference fringes observed when the ingot was observed by a Fizeau interferometer while transmitting light rays through the rod-like silica glass ingot in the longitudinal direction thereof. In this photograph, homocentric and streak-like disturbance appearing on the contour of the images of white interference fringes indicates the presence of cords.

Figure 7:
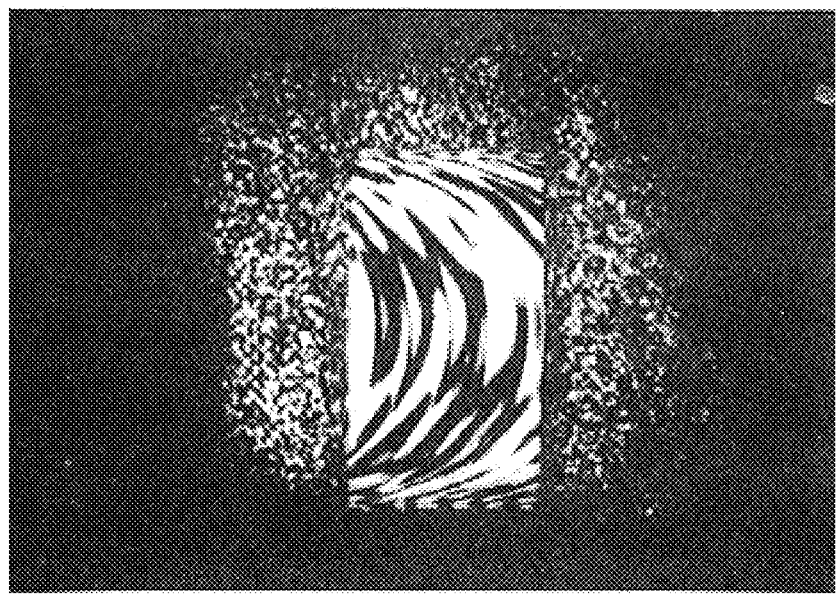

FIG. 7 is a photograph showing the interference fringes observed when the rod-like synthetic silica glass ingot was observed by a Fizeau interferometer while transmitting light rays through the rod-like ingot in the direction perpendicular to the longitudinal axis thereof. In this photograph, the circular streaks indicate the presence of cords.

Figure 8:
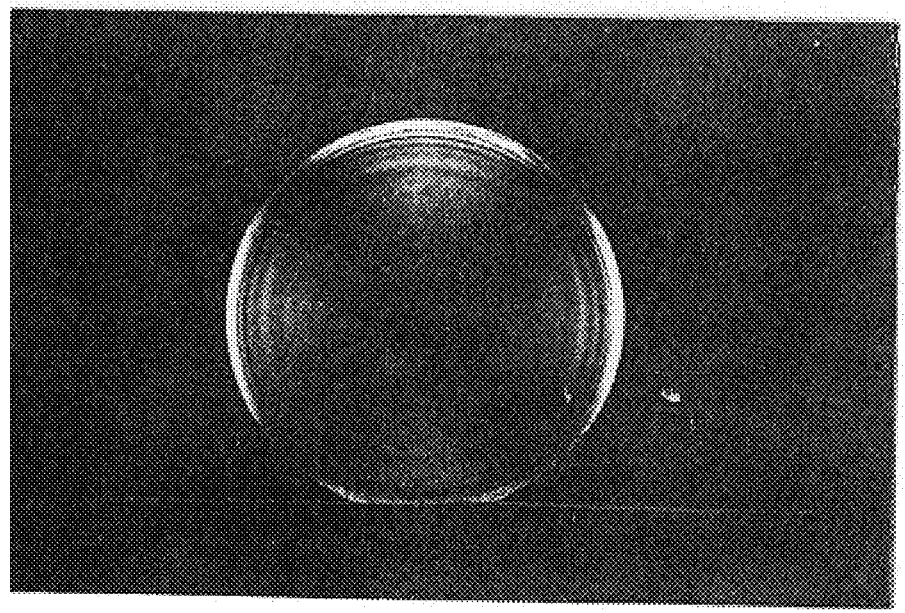
FIG. 8 is a photograph showing cords observed when a rod-like synthetic silica glass ingot used in an Example of the present invention was examined by a strain detector, while transmitting light rays through the ingot along the longitudinal axis of the ingot

FIG. 8 is a photograph showing the images of strains observed when the rod-like synthetic silica glass ingot was observed by a strain detector while transmitting light rays through the rod-like ingot in the direction along the longitudinal axis of the ingot. In this photograph, homocentric streaks appearing in the peripheral contour of the images indicate the presence of cords.

Figure 9:
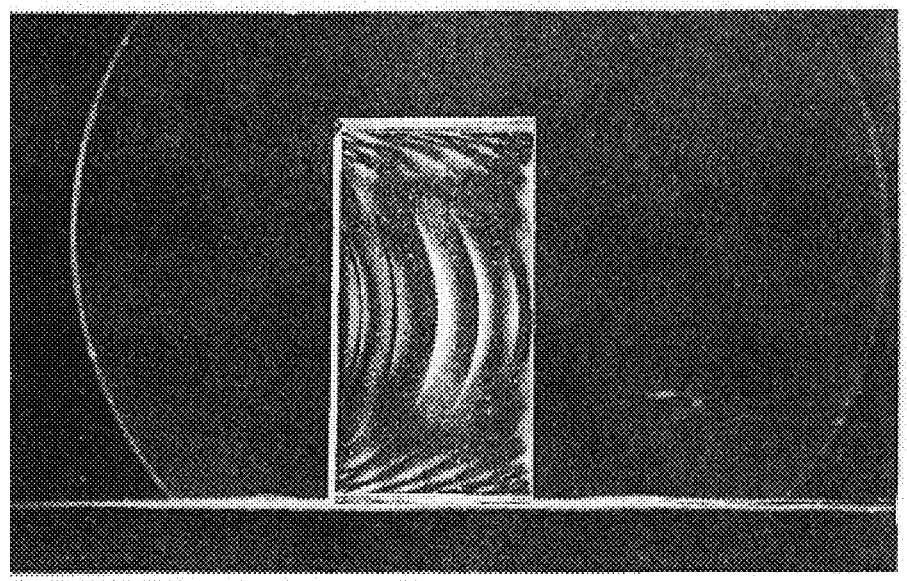
FIG. 9 is a photograph showing cords observed when the rod-like synthetic silica glass ingot shown in FIG. 8 was examined by a strain detector, while transmitting light rays through the ingot in the direction perpendicular to the longitudinal axis of the ingot.

FIG. 9 is a photograph showing the images of strains observed when the rod-like synthetic silica glass ingot was observed by a strain detector while transmitting light rays through the rod-like ingot in the direction perpendicular to the longitudinal axis of the ingot. In this photograph, circular streaks indicate the presence of cords.

Both ends of the foregoing rod-like synthetic silica glass ingot secured to chucks of a silica glass-processing lathe were connected, through welding, to silica glass support rods having a diameter identical to that of the silica glass ingot, followed by locally heating the left end of the silica glass ingot to be homogenized with oxygen-propane flame while synchronously rotating the right and left chucks of the silica glass-processing lathe at a number of revolutions of 30 rpm to form a molten zone in sufficiently molten state within the rod-like glass ingot. After forming the molten zone in the rod-like silica glass ingot, the numbers of revolutions of the right and left chucks are independently controlled such that these chucks were ultimately rotated in opposite directions at numbers of revolutions of 50 rpm for the left chuck and 50 rpm for the right chuck.

Thereafter, a burner was slowly shifted at a constant velocity (20 mm/min in this Example) along the rotation axis to thus move the molten zone over the entire length of the rod-like ingot. At an instance when the molten zone was completely moved over the entire length of the rod-like ingot, the right and left chucks were again synchronously rotated to thus complete the first homogenization step.

Then the rod-like glass ingot was formed into a ball-like synthetic silica glass material by returning the burner to the left end of the glass ingot, i.e., to the side of the movable chuck while synchronously rotating the right and left chucks of the lathe, softening the left side portion of the rod-like glass ingot through heating, then slowly pushing the burner towards the right fixed chuck and at the same time, gradually moving the burner towards the right hand side while rotating the chucks in the same direction at different numbers of revolutions. In this Example, the ball-like synthetic silica glass had a diameter of 170 mm (first forming step).

The ball-like synthetic silica glass thus formed into a body having a ball-like shape and cut away from the support rods was observed with a stain detector. The results thus obtained are shown in FIGS. 10 and 11.

Figure 10:
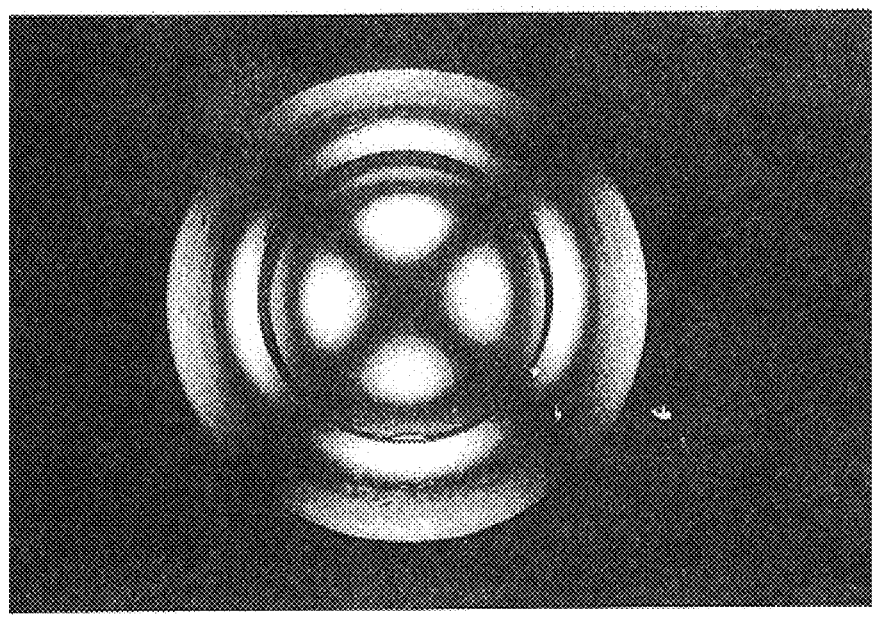
FIG. 10 is a photograph showing cords observed when a ball-like synthetic silica glass material prepared in an Example of the present invention as an intermediate in the forming step was examined by a strain detector, while transmitting light rays through the silica glass material in the direction along the line connecting both ends of the ball-shaped synthetic silica glass

FIG. 10 is a photograph showing cords observed when the ball-like synthetic silica glass was examined by a strain detector, while transmitting light rays through the ball-like silica glass in the direction along the line connecting both cut surfaces of the ball-like silica glass. In this photograph, white portions indicate the presence of strains, but the contours of the white portions were not disturbed. This indicates that there was not any cords.

Figure 11:
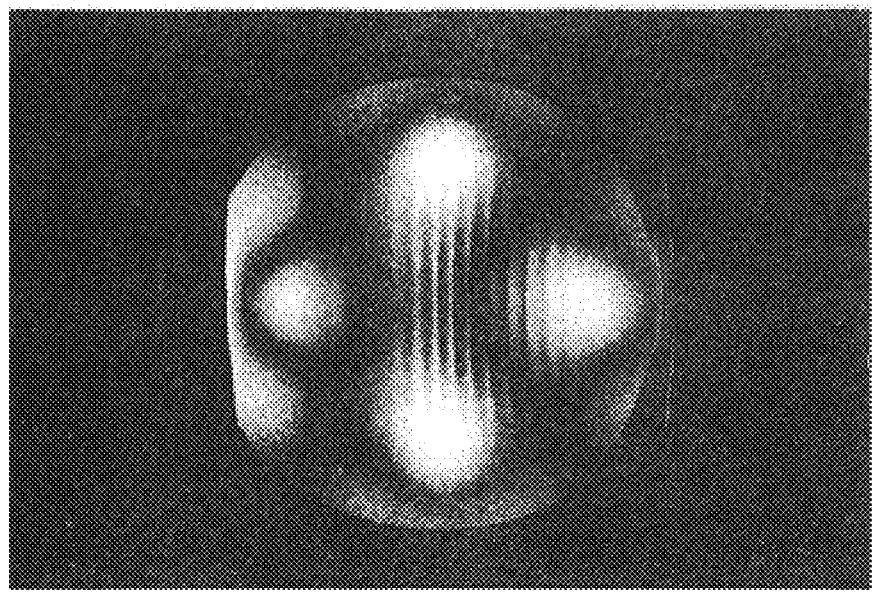
FIG. 11 is a photograph showing cords observed when the ball-shaped synthetic silica glass shown in FIG. 10 was examined by a strain detector, while transmitting light rays through the silica glass material in the direction perpendicular to the line connecting both ends of the ball-shaped synthetic silica glass.

FIG. 11 is a photograph showing cords observed when the ball-like synthetic silica glass shown in FIG. 10 was examined by a strain detector, while transmitting light rays through the ball-like silica glass in the direction perpendicular to the line connecting the foregoing two cut surfaces. In this photograph, white portions indicate the presence of strains, the streak-like disturbance in the images appearing on the white portions indicate the presence of cords and it can be concluded that a substantial number of cords were present in this case as compared with the results shown in FIG. 10.

The synthetic silica glass formed into a ball-like shape was cut away from the support rods, then put on a support base in such a manner that one end thereof comes in contact with the surface of the support base to thus turn the silica glass ball at an angle of 90°, a support rod fixed to the chuck of the silica glass-processing lathe was connected, through welding, to one side of the central and horizontal portion of the ball-like silica glass and then another support rod likewise fixed to the chuck of the lathe was connected, through welding, to the other opposite side of the central and horizontal portion thereof.

After the ball-like synthetic silica glass was secured to the right and left chucks, the chucks were synchronously rotated and then slowly drawing the ball-like silica glass in such a manner that the distance between these chucks was increased while heating the whole of the ball-like silica glass by a burner to give a synthetic silica glass material having constricted parts each positioned near the corresponding support rod.

The synthetic silica glass rod produced in this manner was first partially softened with heating by a burner to form a molten zone, then the burner was shifted while rotating the silica glass rod having the molten zone thus formed in such a manner that the numbers of revolutions of the right and left ends differ from one another, for instance, rotating the left and right ends at 25 rpm and 30 rpm respectively, and simultaneously making the diameter of the silica glass rod uniform by moving the movable chuck of the lathe towards the other chuck along the rotation axis to compress the portions of the rod having a diameter smaller than the desired level and moving the movable chuck of the lathe so that the silica glass rod is drawn to reduce the diameter of the portions thereof having a diameter greater than the desired level to give a synthetic silica glass rod having a constant diameter (60 mm in this Example) (second forming step).

The resulting synthetic silica glass rod has a length of about 900 mm and the loss in weight thereof includes an evaporation loss through heating and a loss due to cutting the ball-like synthetic silica glass away from the support rods.

The synthetic silica glass rod which had been processed in the second forming step was subjected to a second homogenization treatment in the same manner used in the first homogenization step. The silica glass rod obtained after the second homogenization treatment was rotated by synchronously rotating the right and left chucks of a silica glass-processing lathe at 25 rpm and the left end portion thereof was softened with heating. Then the right and left chucks of the lathe were rotated so as to cause a difference in the number of revolutions (in this Example, for instance, the left chuck was rotated at 25 rpm and the right chuck at 30 rpm) and the silica glass rod was compressed by moving the right and left chucks of the lathe such that the distance therebetween was decreased while moving a burner to increase the outer diameter of the silica glass rod. Thus, there was produced, in this Example, a synthetic silica glass rod having a diameter of 100 mm (premolding for molding in a graphite mold).

Then the synthetic silica glass rod whose diameter was increased through the premolding was cut away from the support rods, introduced into a graphite mold prepared in advance, followed by forming into a usual disc shape as an optical part, and heating and gradual cooling treatments for the removal of strains.

The forming treatment was carried out by heating the graphite mold including the silica glass rod to a high temperature of not less than 1800° C. in a vacuum furnace.

The heating % gradual cooling treatment was performed by introducing the resulting formed article of synthetic silica glass in an electric furnace, heating at 1150° C. for 50 hours in the air and then gradually cooling at a velocity of −5° C./hr. After removing the portion contaminated through the contact with the graphite mold, the synthetic silica glass disc thus formed had a diameter of 170 mm, a thickness of 55 mm and a weight of about 2.7 kg.

To inspect the resulting synthetic silica glass disc for the presence of cords and the refractive index distribution in the direction of the circumferential plane, opposite positions on the circumferential face were cut off to form a sample for observation having planes parallel to one another and the sample was inspected for the presence of cords using a Fizeau interferometer and a strain detector. The results thus obtained are shown in FIGS. 12 and 13.

Figure 12:
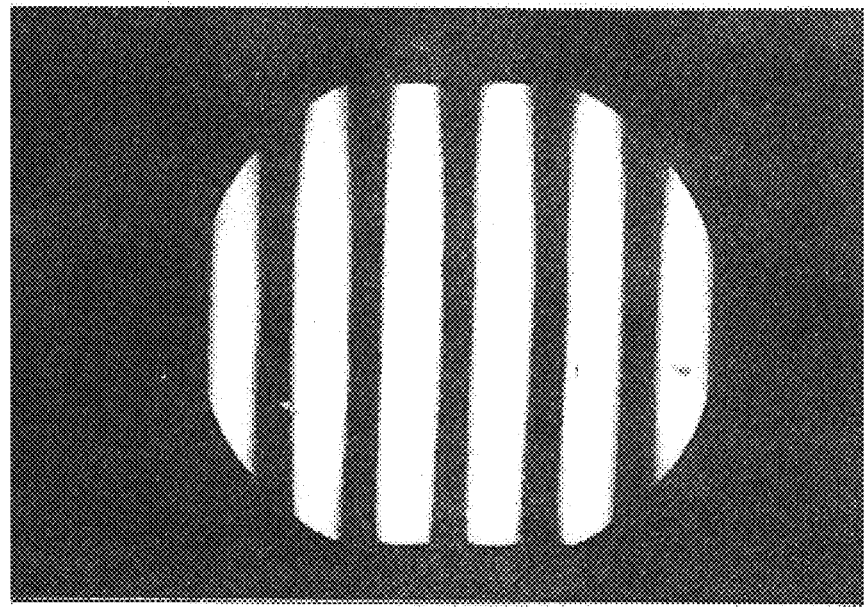
FIG. 12 is a photograph showing interference fringes observed when a sample disc of synthetic silica glass as a product prepared in an Example of the present invention was examined by a Fizeau interferometer while transmitting light rays through the sample disc in the direction of the thickness of the sample disc and FIG. 13 is a photograph showing interference fringes observed when the sample disc of synthetic silica glass shown in FIG. 12 was examined by a Fizeau interferometer while transmitting light rays through the sample disc in the direction perpendicular to the thickness of the sample disc.

FIG. 12 is a photograph showing interference fringes observed when a sample disc of synthetic silica glass as a product prepared in an Example of the present invention was examined by a Fizeau interferometer while transmitting light rays through the sample disc in the direction of the thickness of the sample disc. This photograph does not show any disturbance in the contours of the white portions of the interference fringes and this indicates that the sample disc includes no cord.

Figure 13:
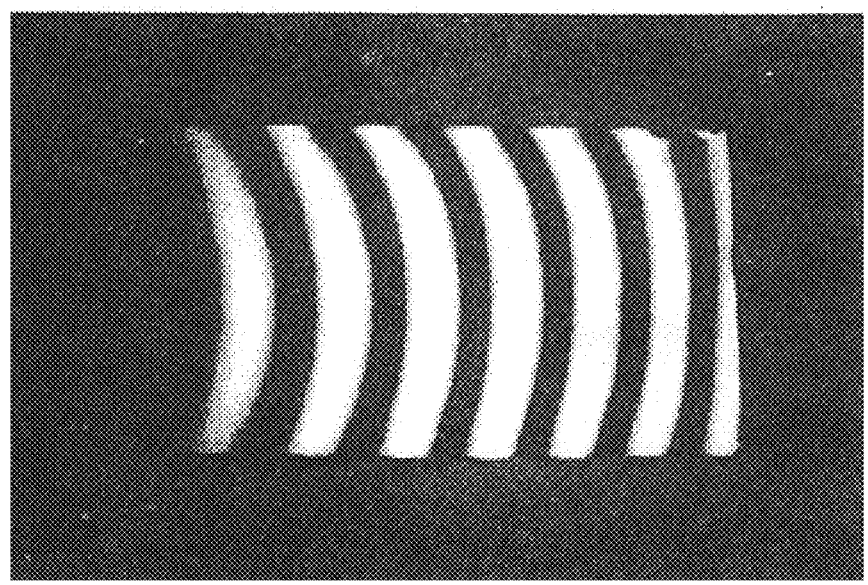

FIG. 13 is a photograph showing interference fringes observed when the sample disc of synthetic silica glass shown in FIG. 12 was examined by a Fizeau interferometer while transmitting light rays through the sample disc in the direction perpendicular to the thickness of the sample disc. This photograph does not show any disturbance in the contours of the white portions of the interference fringes and this indicates that the sample disc includes no cord. The homogeneity in the refractive index observed in this Example was found to be $\pm 1 \times 10^{-6}$ as expressed in terms of $\Delta n$.

Figure 14:
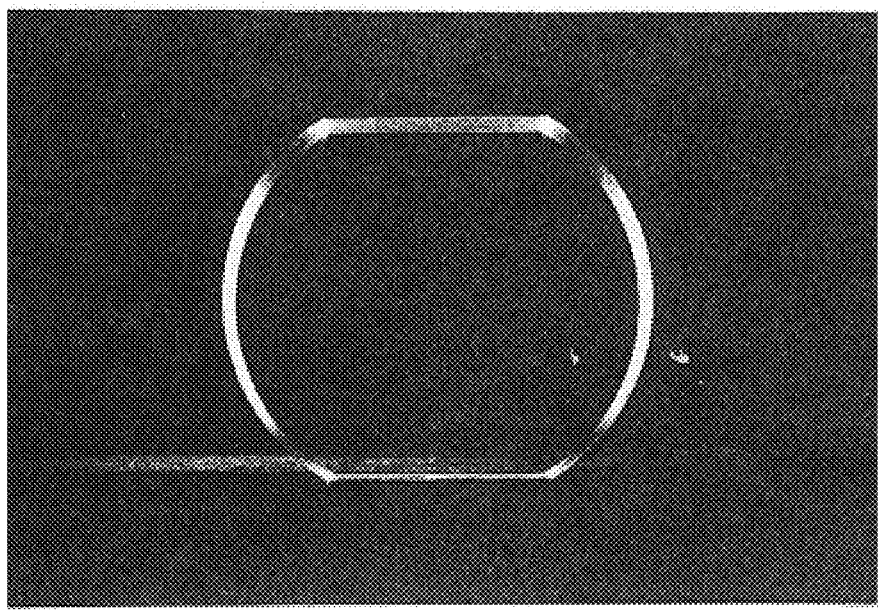
FIG. 14 is a photograph showing cords observed when a sample disc of synthetic silica glass as a product prepared in an Example of the present invention was examined by a strain detector while transmitting light rays through the sample disc in the direction of the thickness of the sample disc and FIG. 15 is a photograph showing cords observed when the sample disc of synthetic silica glass shown in FIG. 14 was examined by a strain detector while transmitting light rays through the sample disc in the direction perpendicular to the thickness of the sample disc (any cord was not observed).

FIG. 14 is a photograph showing cords observed when a sample disc of synthetic silica glass as a product prepared in an Example of the present invention was examined by a strain detector while transmitting light rays through the sample disc in the direction of the thickness of the sample disc. This photograph indicates that any cord is not present at all.

Figure 15:
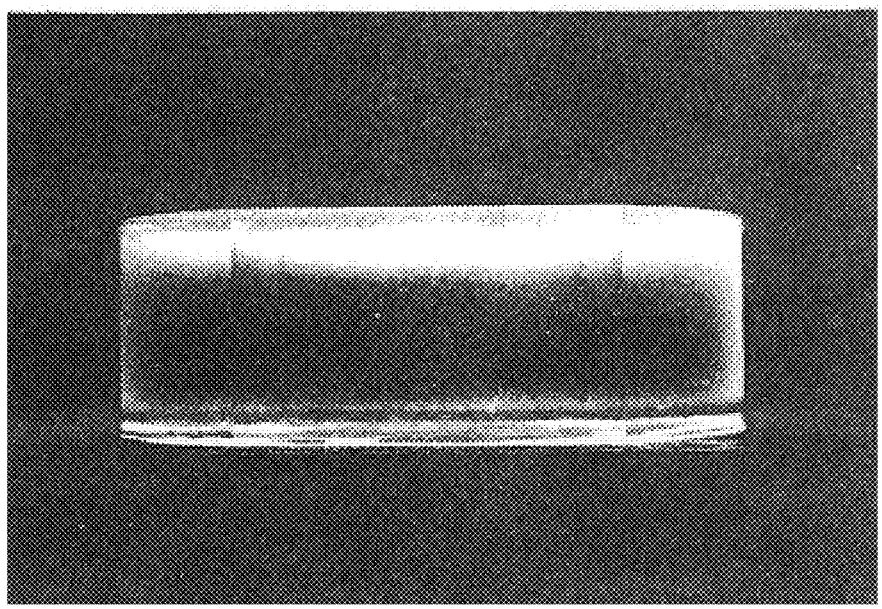

FIG. 15 is a photograph showing cords observed when the sample disc of synthetic silica glass shown in FIG. 14 was examined by a strain detector while transmitting light rays through the sample disc in the direction perpendicular to the thickness of the sample disc. This photograph indicates that no cord is detected.

A sample having a length of 1 cm, a breadth of 1 cm and a height of 5 cm was cut from this synthetic silica glass disc, the surface thereof was polished and used in the test for determining the transmittance characteristics to ultraviolet rays using an ultraviolet spectrophotometer.

In this Example, it was found that the sample of the silica glass disc had an apparent transmittance of 90.5% for UV light rays of 193 nm and an internal transmittance of 99.9%, as determined by the spectrophotometer. In this respect, the internal transmittance (%) is determined by the following relation: Internal Transmittance (%) =Apparent Transmittance (%) ÷Theoretical Transmittance (%).

The internal transmittance of a high precision optical system for ArF stepper was calculated on the basis of the foregoing values while assuming the optical path length thereof to be 50 cm for convenience and was found to be 94.6%.

Moreover, the sample had an apparent transmittance of 92.0% for UV light rays of 248 nm and an internal transmittance of not less than 99.9%. The calculated internal transmittance of a high precision optical system for ArF stepper was found to be 97.3% while the optical length was assumed to be identical to that used above.

The sample of a synthetic silica glass formed article which was cut from the synthetic silica glass disc prepared in this Example was inspected for the contents of impurities and the following results were obtained: Na: 15 ppb; Li: 1.5 ppb; Be: not more than 0.05 ppb; B: not more than 0.5 ppb; Mg: not more than 0.3 ppb; Al: not more than 1 ppb; P: not more than 20 ppb; K: not more than 0.5 ppb; Ca: 17 ppb; Ti: 2.2 ppb; V: not more than 0.1 ppb; Cr: not more than 0.1 ppb; Mn: not more than 0.1 ppb; Co: not more than 0.1 ppb; Fe: 0.3 ppb; Ni: not more than 0.1 ppb; Cu: not more than 0.05 ppb; Zn: 6.8 ppb; Ge: not more than 0.1 ppb; As: not more than 1 ppb; Sr: not more than 0.05 ppb; Zr: not more than 0.1 ppb; Ag: not more than 0.05 ppb; Sb: not more than 0.2 ppb; Ba: not more than 0.1 ppb; Ce: not more than 0.1 ppb; Pb: not more than 0.1 ppb; Bi: not more than 0.05 ppb; Th: not more than 0.05 ppb; and U: not more than 0.05 ppb.

In this respect, the quantitative analysis of P was carried out by the ICP emission spectroscopic analysis; the quantitative analysis of Na, K, Ca, Zn, Cr, Fe, Ni, Cu and Mg was carried out by the atomic-absorption spectroscopy; and the contents of other impurities were determined by the ICP mass spectrometry.

EXAMPLE 2

A synthetic silica glass ingot having the same outer diameter and size as those for the silica glass ingot prepared in Example 1 was connected, through welding, to support rods having the same diameter at both ends of the former, the support rods were secured to a silica glass-processing lathe, then the left end of the silica glass ingot was heated by the fire flame of an oxygen-propane burner while synchronously rotating the right and left chucks of the lathe and after the left end of the ingot was sufficiently softened, the left and right chucks were rotated at 30 rpm and 25 rpm respectively in the same direction through independent control thereof. Then the burner was gradually shifted towards the right direction, followed by elimination of the variation in the outer diameter of the ingot by repeating compression and drawing operations depending on the changes in the outer diameter. After the control of the outer diameter, the variation thereof was found to be not more than ±1 mm.

Then the silica glass ingot was subjected to a first homogenization step, a first forming step, a step for cutting a ball-like synthetic silica glass material away from the support members, a step for changing the support rod-fitting positions, a second forming step, a second homogenization step, a premolding step, a molding step and a heating % gradual cooling step, in the same manner used in Example 1.

It was found that the change in the outer diameter observed in the second forming step was not more than 1 mm and that the change in the outer diameter observed in the first and second homogenization steps was also not more than 1 mm.

The homogeneity in the refractive index of the product was found to be $\pm 0.5 \times 10^{-6}$ as expressed in terms of $\Delta n$. Moreover, any cord was not observed in the three directions of the resulting product.

Comparative Example 1

Then a rod-like synthetic silica glass having the same size used in Example 1 and prepared in the same manner used in Example 1 was subjected to a fist homogenization treatment identical to that used in Example 1.

Then the rod-like synthetic silica glass which had been subjected to the first homogenization treatment was cut away from the support rods, the shape thereof was determined and the silica glass rod was found to have an outer diameter of 60 mm and a length of 900 mm. The silica glass rod was vertically put on the bottom of a box-like graphite container having a square inner bottom surface having the length of the side of 200 mm and a height of 400 mm and the graphite container including the silica glass rod was introduced into a vacuum furnace. In this respect, the silica glass rod was vertically put on the bottom of the container while taking care not to mold the rod into a bent or inclined shape. For this reason, the degree of perpendicularity of the silica glass rod and the verticality of the end faces thereof require corresponding degree of precision.

After exhausting the furnace to a vacuum, nitrogen was charged therein and the silica glass rod was molded with heating to a temperature of not less than 1800° C. After completion of the molding, the molded article was cooled to give a disc-like synthetic silica glass molded article having a length of 200 mm, a breadth of 200 mm and a height of 60 mm.

Then the disc-like molded article was arranged in a box-like graphite container having an internal size: 60 mm (length)×650 mm (breadth)×200 mm (height) while turning the molded article sideways so that the direction of the height of the molded article was in consistent with the direction of the length of the box-like container and the disc-like molded article was again formed. The synthetic silica glass formed article thus molded twice was a square column having a square end face whose length of the side was 60 mm and a length of 650 mm. The edge portions of the square column-like synthetic silica glass were scraped away by a grinder to round the corners thereof and then silica glass support rods were connected, through welding, to both ends thereof.

Then the left end of the rod-like synthetic silica glass material having rounded corners, i.e., cylindrical silica glass material was heated by a burner and the burner was slowly shifted towards the right hand direction while rotating the left and right chucks in the same direction at numbers of revolutions of 30 rpm for the left chuck and 25 rpm for the right chuck, after sufficiently softening the silica glass rod, to induce a slight difference therebetween and to thus convert the rod-like synthetic silica glass into a complete cylindrical silica glass material.

The burner was again shifted towards the left end of the cylindrical synthetic silica glass to perform a homogenization treatment like the second homogenization treatment used in Example 1.

The resulting cylindrical synthetic silica glass was subjected to a forming step and a strain-removing step in the same manner used in Examples 1 and 2, followed by removal of portions contaminated through the contact with graphite to give a synthetic silica glass molded article having an outer diameter of 100 mm and a height of 70 mm. The weight of the molded article of synthetic silica glass was found to be 1.2 kg and any cord was not observed in the three directions perpendicular to one another. The homogeneity of the refractive index of the molded article was determined by an interferometer and found to be $\pm 1 \times 10^{-6}$ as expressed in terms of $\Delta n$. However, the molded article emitted, over the entire length thereof, fluorescent light rays of pale green color when it was irradiated with ultraviolet rays having a wavelength of 254 nm emitted from a mercury lamp.

Figure 16:
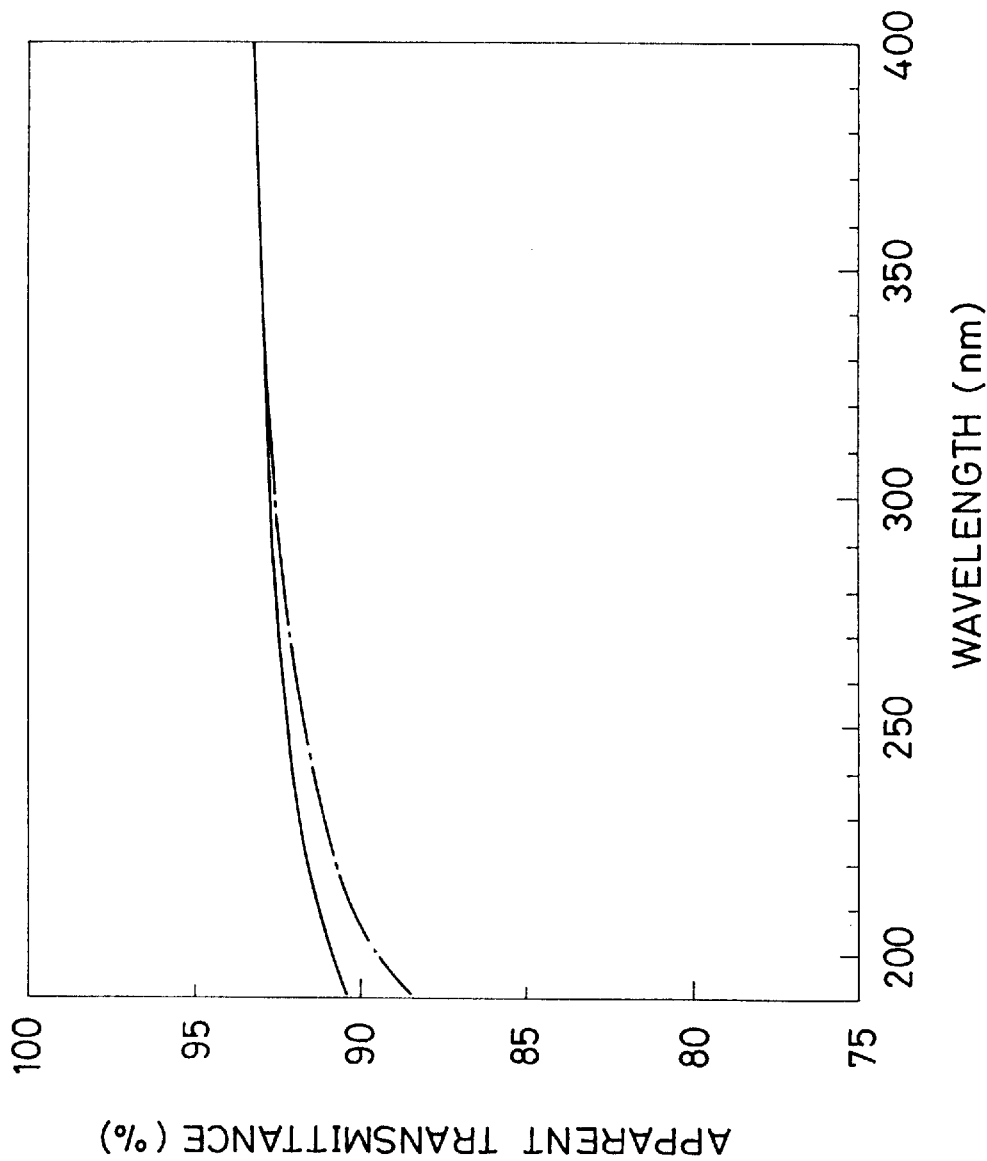
FIG. 16 is a graph showing curves of apparent transmittance, to irradiated ultraviolet rays, of a sample disc of synthetic silica glass as a product prepared in an Example of the present invention (shown by a solid line) and a sample of a formed article of synthetic silica glass prepared in Comparative Example (shown by an alternate long and short dash line) as measured by a transmittance-determining device.

A sample having a length of 1 cm, a breadth of 1 cm and a height of 5 cm was cut from the molded article of synthetic silica glass, followed by polishing the surface thereof and examination of the transmittance to ultraviolet rays using an ultraviolet spectrophotometer. For the purpose of comparison, a sample having the same shape was also cut from the molded article of synthetic silica glass prepared in Example 1 and the transmittance to ultraviolet rays was determined in the same manner. The results thus obtained are plotted on FIG. 16.

The sample of this Comparative Example 1 had an apparent transmittance as determined at 193 nm of 89.6% and an internal transmittance of 98.9%. The transmittance calculated was found to be 57.4% while assuming the same optical path length used in Example 1. Moreover, the sample had an apparent transmittance as determined at 193 nm of 91.7% and an internal transmittance of 99.7%. The transmittance calculated was found to be 84.9% while assuming the same optical path length used in Example 1.

The synthetic silica glass molded article according to Comparative Example 1 was inspected for the contents of impurities and the following results were obtained: Na: 110 ppb; Li: 15 ppb; Be: not more than 0.05 ppb; B: not more than 0.5 ppb; Mg: not more than 0.3 ppb; Al: not more than 1 ppb; P: not more than 20 ppb; K: 37 ppb; Ca: 20 ppb; Ti: 2.5 ppb; V: not more than 0.1 ppb; Cr: not more than 0.1 ppb; Mn: not more than 0.1 ppb; Co: not more than 0.1 ppb; Fe: 6 ppb; Ni: not more than 0.1 ppb; Cu: not more than 0.05 ppb; Zn: 11 ppb; Ge: not more than 0.1 ppb; As: not more than 1 ppb; Sr: not more than 0.05 ppb; Zr: not more than 0.1 ppb; Ag: not more than 0.05 ppb; Sb: not more than 0.2 ppb; Ba: not more than 0.1 ppb; Ce: not more than 0.1 ppb; Pb: not more than 0.1 ppb; Bi: not more than 0.05 ppb; Th: not more than 0.05 ppb; and U: not more than 0.05 ppb.

What is claimed is:

1. A method for preparing a high purity ball-shaped synthetic silica glass optical article comprising the steps of:

providing a rod-shaped synthetic silica glass having end faces at both sides thereof and having fewer cords per unit volume viewed in a direction perpendicular to a line connecting said end faces, relative to the number of cords per unit volume viewed in the direction along said line connecting said end faces, said synthetic silica glass being optically homogeneous in said direction perpendicular to said line connecting said end faces;

establishing support portions at said end faces thereof;

heating said rod-shaped synthetic silica glass while rotating said rod-shaped synthetic silica glass around an axis connecting said support portions to form a molten zone;

deforming said molten zone of said rod-shaped synthetic silica glass by means of the application of pressure, said pressure applied along said axis connecting said support portions to form a ball-shaped synthetic silica glass having end faces and a side face positioned between said end faces, said side face externally projected beyond the outline of said end faces, said optical article characterized by a lesser number of cords per unit volume viewed in a direction perpendicular to a line connecting said end faces relative to the number of cords per unit volume viewed in a direction along said line connecting said end faces, said ball-shaped synthetic silica glass being optical homogeneous in a direction perpendicular to said line connecting said end faces; and cutting off from said ball-shaped synthetic silica glass said support portions.

* * * * *